(12) United States Patent
Yagiura et al.

(10) Patent No.: US 8,067,295 B2
(45) Date of Patent: Nov. 29, 2011

(54) MANUFACTURING METHOD OF SOLAR CELL MODULE, AND SOLAR CELL AND SOLAR CELL MODULE

(75) Inventors: Toshio Yagiura, Kobe (JP); Shingo Okamoto, Toyonaka (JP); Atsushi Nakauchi, Kaizuka (JP)

(73) Assignee: SANYO Electric Co., Ltd, Moriguchi-shi (JP)

( * ) Notice: Subject to any disclaimer, the term of this patent is extended or adjusted under 35 U.S.C. 154(b) by 943 days.

(21) Appl. No.: 11/527,494

(22) Filed: Sep. 27, 2006

(65) Prior Publication Data

US 2007/0074756 A1 Apr. 5, 2007

(30) Foreign Application Priority Data

Sep. 30, 2005 (JP) ................................. 2005-288181

(51) Int. Cl.
| | |
|---|---|
| H02N 6/00 | (2006.01) |
| H01L 31/00 | (2006.01) |
| H01L 21/00 | (2006.01) |
| H01L 21/82 | (2006.01) |
| H01L 21/30 | (2006.01) |
| H01L 21/46 | (2006.01) |

(52) U.S. Cl. .............. 438/460; 438/57; 438/66; 438/67; 438/68; 438/98; 438/458; 438/461; 438/129; 136/244; 136/252; 136/256

(58) Field of Classification Search .................. 136/244, 136/252, 256; 438/19, 129, 461, 571, 597, 438/608, 96, 97, 98, 57, 66–68, 458, 460
See application file for complete search history.

(56) References Cited

U.S. PATENT DOCUMENTS

| | | | | |
|---|---|---|---|---|
| 3,369,939 | A | | 2/1968 | Myer |
| 4,089,705 | A | * | 5/1978 | Rubin ........................... 136/244 |
| 4,789,641 | A | * | 12/1988 | Inuzuka ......................... 438/62 |
| 5,021,099 | A | * | 6/1991 | Kim et al. ..................... 136/249 |

(Continued)

FOREIGN PATENT DOCUMENTS

DE 103 47 647 A1 5/2005

(Continued)

OTHER PUBLICATIONS

English machine translation of JP2001094127A, Apr. 2001.*

(Continued)

*Primary Examiner* — Basia Ridley
*Assistant Examiner* — Lindsey Bernier
(74) *Attorney, Agent, or Firm* — Westerman, Hattori, Daniels & Adrian, LLP

(57) ABSTRACT

A double-side light receiving solar cell in a planer regular hexagon shape and having first electrodes on both surfaces are divided into four pieces by a line A-A' connecting two opposing apexes and by a line B-B' perpendicular to the line A-A' and connecting center points on two opposing sides. By matching oblique lines of two divided pieces without misalignment and with respective surfaces in an inversed state, the first electrodes on the same side of the two divided pieces align along the same single straight line. Then, the first electrodes that are on the same side are connected with a first interconnecter, thereby constructing a unit having a rectangular outline. Units thus constructed are arranged so that relevant sides match without misalignment. By handling on a unit basis as described above, it is possible to facilitate an arrangement of the cells and an electricity connection work.

11 Claims, 33 Drawing Sheets

U.S. PATENT DOCUMENTS

| | | | | |
|---|---|---|---|---|
| 5,620,528 | A | * | 4/1997 | Schade et al. ................. 136/244 |
| 5,679,176 | A | * | 10/1997 | Tsuzuki et al. ............... 136/251 |
| 6,559,479 | B1 | * | 5/2003 | Ludemann ...................... 257/99 |
| 2003/0075211 | A1 | * | 4/2003 | Makita et al. ................. 136/244 |

FOREIGN PATENT DOCUMENTS

| | | | |
|---|---|---|---|
| EP | 1445804 | A1 * | 8/2004 |
| JP | 9-148601 | A | 6/1997 |
| JP | 11-354822 | A | 12/1999 |
| JP | 11354822 | A * | 12/1999 |
| JP | 2001-94127 | A | 4/2001 |
| JP | 2001-111084 | | 4/2001 |
| JP | 2002-26361 | A | 1/2002 |
| JP | 2005-123527 | | 5/2005 |

OTHER PUBLICATIONS

English machine translation of JP11354822A, Dec. 1999.*
Korean Written Opinion Filing Notification dated Nov. 27, 2007, Application No. 10-2006-94641.
European Search Report dated Nov. 2, 2006, Application No. EP 06 02 0447.
Chinese Office Action (Notice of Refusal) dated Nov. 6, 2009, issued in corresponding Chinese patent application No. 200610141630.6.
Japanese Office Action dated Aug. 23, 2011, issued in corresponding Japanese Patent Application No. 2006-256317.

* cited by examiner

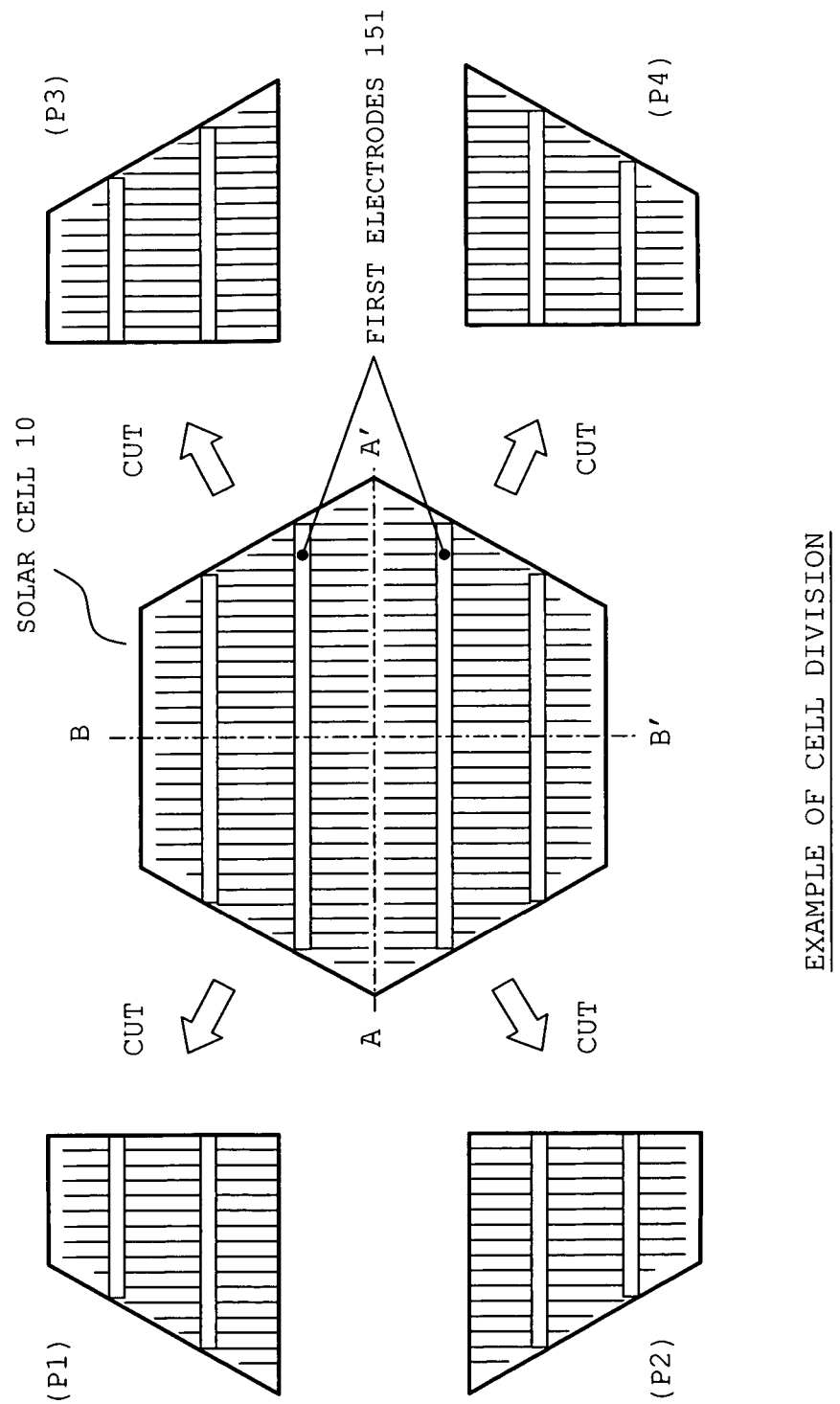

EXAMPLE OF UNIT CONFIGURATION

EXAMPLE OF UNIT CONFIGURATION

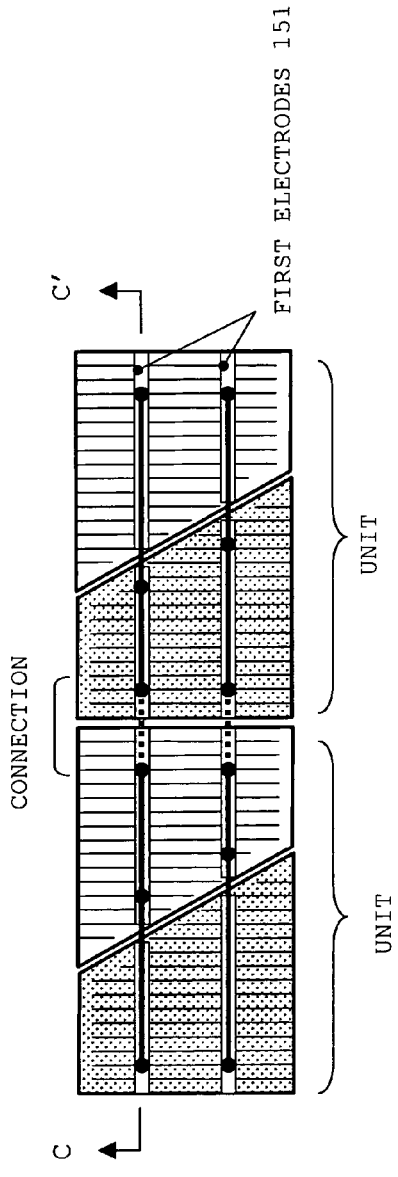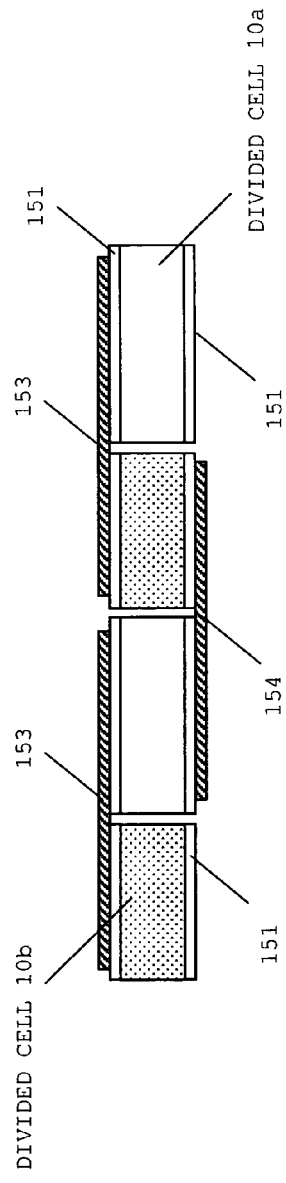

D-D' CROSS-SECTIONAL VIEW

SERIAL CONNECTION OF UNITS

E-E' CROSS-SECTIONAL VIEW

PARALLEL CONNECTION OF UNITS

SERIAL CONNECTION OF UNITS

EXAMPLE OF UNIT CONFIGURATION

FRONT SURFACE OF SOLAR CELL

REAR SURFACE OF SOLAR CELL

EXAMPLE OF UNIT CONFIGURATION

EXAMPLE OF UNIT CONFIGURATION

AFTER PARALLEL CONNECTION

BEFORE PARALLEL CONNECTION

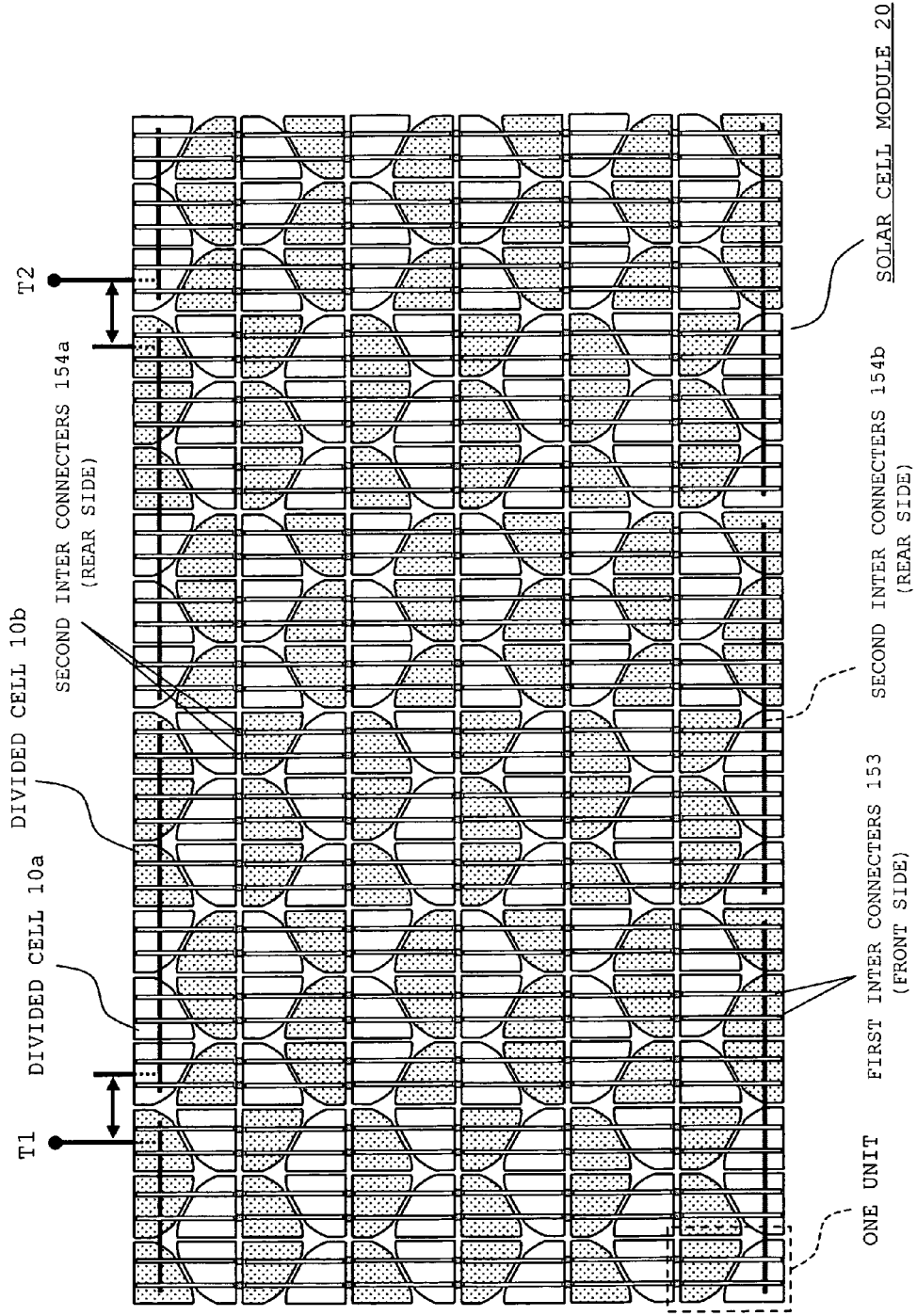

MANUFACTURING METHOD OF SOLAR CELL MODULE, AND SOLAR CELL AND SOLAR CELL MODULE

This application claims priority under 35 U.S.C. §119 of Japanese Patent Application No. 2005-288181 filed Sep. 30, 2005.

BACKGROUND OF THE INVENTION

1. Field of the Invention

The present invention relates to a manufacturing method of a solar cell module, and to a solar cell and a solar cell module. In particular, the present invention is suitable to be applied to a solar cell module containing double-side light receiving solar cells in which sunlight may incident from front and rear faces of them, and a manufacturing method thereof and a solar cell to be applied to such solar cell module. The present invention is suitably applicable also to the solar cell module which contains not double-side light receiving solar cells but one-side light receiving solar cells.

2. Description of the Related Art

In recent years, against the backdrop of problems such as depletion of petroleum resources and global warming, development and spread of clean energy source without using petroleum resources have been taken up as a global-scale challenge. Photovoltaic solar systems, which use infinite solar energy without emitting $CO_2$ and such, have been gaining attentions with an expectation as playing a major role towards the solution for such a challenge.

A typical photovoltaic solar system employs a solar cell module generally constituted from several tens of solar cells arranged in a planar state, in order to protect the solar cells as a power production source from being injured and to facilitate handling of the solar cells. Here, the solar cell module is commonly configured as a rectangle, about 1 m to 2 m on a side, so that the solar cells may be arranged efficiently within a given area, and the handling in transport and installation may be facilitated.

On the other hand, as shown in (a-2) of FIG. 28, a shape of an ingot (single crystal silicon) 30, which is used as a substrate material for the solar cells, is cylindrical by the nature of a manufacturing method thereof. Accordingly, slicing the ingot as it is to produce a cell substrate 31 necessarily makes a shape of the solar cells circular. This results in a problem that a filling rate of solar cells 10 to the solar cell module 20 becomes low due to a large area of spaces between the solar cells, even when the solar cells are arranged in a manner most efficiently as shown in (a-1) of FIG. 28, for example.

By contrast, as shown in (b-1) and (b-2) of FIG. 28, the filling rate of the solar cells 10 may be improved by making the shape of the solar cells 10 square. However, at the same time, this causes a problem that an unused area in the ingot 30 (hatched area in (b-2) of FIG. 28) that is not used as the substrate 31 becomes large, thus considerably decreasing use efficiency of the ingot.

Further, as shown in (c-1) and (c-2) of FIG. 28, making the shape of the solar cells 10 regular hexagonal may improve the filling rate of the solar cells 10 as compared to the case of the circular shape, and may also improve the use efficiency of the ingot 30 as compared to the case of the square shape. However, in this case, the solar cell module 20 still includes spaces at which the solar cells 10 may not be arranged, and the unused area of the ingot 30 that may not be used as the substrate 31 remains to no small extent.

In order to address such a problem, Japanese Patent Application Laid-Open No. 2001-94127 describes a solar cell module, which may improve both the filling rate of the solar cell 10 and the use efficiency of the ingot 30. According to this prior art invention, as shown in FIG. 29B, the substrate 31 is cut out of the ingot 30 as a regular hexagon that is larger than a regular hexagon inscribed in an outer circumference of the ingot 30 and smaller than a regular hexagon in which an outer circumference of the ingot 30 is inscribed (the shape cut out in this manner is hereinafter referred to as "pseudohexagon"). With such an arrangement, it is possible to suppress the unused area of the ingot 30 that is not used as the substrate 31, and the use efficiency of the ingot 30 may be improved.

Further, in this prior art invention, when producing the solar cell 10 from the substrate 31 that has been cut out in the above manner, the solar cell 10 is divided into two or four pieces by a line P-P' and/or a line Q-Q' shown in FIG. 29B, and these pieces are arranged as shown in FIGS. 29A or 29C. With this, the area of the spaces at which the solar cells 10 may not be arranged may be suppressed, thereby improving the filling rate of the solar cell 10.

In addition, Japanese Patent Application Laid-Open No. H09-148601 discloses an arrangement in which a solar cell in a regular hexagonal or pseudohexagonal shape is divided into two pieces by a straight line connecting two opposing apexes or a straight line connecting center points on two opposing sides, and these pieces are arranged in the solar cell module. FIG. 30A illustrates such an arrangement of the solar cell module according to this prior art invention, and FIG. 30B shows a cross-section taken at a line R-R' of FIG. 30A.

It is additionally mentioned that, according to this prior art invention, the solar cells 10 are arranged in the solar cell module 20 so that polarities of the respective cells face the same direction. The solar cells 10 are electrically connected so that one of both surfaces of one solar cell 10 is connected to the other of the both surfaces of a solar cell 10 adjacent thereto are connected with an inter connecter 21.

Further, Japanese Patent Application Laid-Open No. H11-354822 and Japanese Patent Application Laid-Open No. 2002-26361 describe an arrangement in which the solar cells are arranged in a solar cell module so that the directions that polarities of one solar cell face is opposite to the directions that polarities of a solar cell adjacent thereto face. FIG. 31A illustrates such an arrangement of this prior art invention, and FIG. 31B shows a cross-section taken at a line S-S' of FIG. 31A. According to this prior art invention, the surfaces on the same side of the respective solar cells 10 that are adjacent to each other are connected with the inter connecter 21. In this case, it is unnecessary to lead the inter connecter 21 around the cells from one side to the other, and therefore making an electrical connection may be facilitated. Moreover, it is possible to fill the space between the adjacent solar cells 10, and thus improving filling rate of the solar cells 10 to that extent.

In producing a solar cell module, a cumbersome work is required in order to arrange the solar cells and to connect electrically between the cells that have been arranged. In particular, when the solar cell is divided into four small pieces as shown in FIG. 29C, the arrangement becomes even more cumbersome compared to the arrangement of solar cells as they are without dividing. While the above-described Japanese Patent Application Laid-Open No. 2001-94127 shows the state after the arrangement of the cells is completed, any step taken during the arrangement or electrical connection is not described at all.

According to the case shown in FIG. 29C, four types of the solar cells are provided as the solar cells to be arranged. In this case, a problem arises that determination as to which type of the cell should be arranged at a certain position becomes difficult when arranging the four types of the solar cells in the solar cell module. It becomes particularly difficult to instantly determine the type of a solar cell to be selected for a certain position in terms of arrangement directions of electrodes on a solar cell, in a case in which the solar cells are to be arranged so that the polarities of the surfaces of the two adjacent solar cells are inversed as illustrated in FIGS. 31A to 31B.

SUMMARY OF THE INVENTION

An object of the present invention is to provide a manufacturing method of a solar cell module with which an arrangement work and an electricity connection work of solar cells may be significantly facilitated even when a solar cell is divided into small pieces as shown in FIGS. 29A to 29C, as well as to provide a solar cell and a solar cell module that are advantageously applied to this method.

A first aspect according to the present invention relates to a manufacturing method of a solar cell module.

According to the manufacturing method of this aspect, solar cells in a quadrangular shape and capable of forming a rectangular outline by matching oblique lines of the respective solar cells each other are provided. Then, a step is conducted in which, while combining one or more pairs of the solar cells each formed by matching the oblique lines each other, relevant solar cells are connected with a first inter connecter, thereby constructing a cell unit having an outline in one of a rectangular shape and a square shape. Thereafter, a step is conducted in which, while arranging the cell units along a pattern of electric connection of the solar cell module with one sides of the outlines in one of a rectangular shape and a square shape of the cell units respectively matching each other, relevant solar cells between predetermined adjacent cell units are connected with a second inter connecter.

According to the manufacturing method of the solar cell module relating to the first aspect, the solar cells are arranged on a cell unit basis. Here, a cell unit has a rectangular or square outline. Therefore, by arranging the cell units with one sides of the outlines matching each other, the cell units may be easily arranged in parallel both lengthwise and breadthwise.

Therefore, according to the present invention, it is possible to arrange the cell units or the solar cells that constitute a cell unit in directions of both rows and columns smoothly with a simple operation. Further, because the solar cells are arranged on a cell unit basis, it is possible to improve workability in the arrangement of the cells in comparison with a case in which the solar cells are arranged on a cell basis. Moreover, because the solar cells are previously connected with the first inter connecters when constructing a cell unit, it is possible to facilitate the electricity connection work of the solar cells in comparison with a case in which the solar cells are electrically connected while arranging the solar cells. In addition, it is possible to suppress occurrence of misalignment in the arrangement of the solar cells.

A second aspect of the present invention relates to a solar cell that is preferably for an application in the manufacturing method of the solar cell module according to the first aspect as described above.

The solar cell according to this aspect has a shape obtained when one of a regular hexagon and a pseudohexagon is divided by a first straight line connecting a pair of opposing apexes and by a second straight line that perpendicularly intersects with the first straight line and connecting center points of a pair of opposing sides, and the solar cell comprises: a first electrode disposed in parallel to the first straight line; and a second electrode disposed in parallel to the second straight line.

Here, the first electrode is disposed so that, when matching a oblique line of the solar cell with a oblique line of another solar cell, first electrodes on the two solar cells are aligned along a first straight line that is parallel to an arrangement direction of the two solar cells. By this arrangement, it is possible to easily connect the first electrodes on the two solar cells with the first inter connecter when constructing the cell unit.

Further, the second electrode is disposed so that, when constructing a cell unit having a rectangular outline by matching the oblique lines of the two solar cells each other and arranging two cell units in parallel with long sides of the two cell units matching each other, the second electrodes on the respective cell units are aligned along a second straight line that is parallel to an arrangement direction of the cell units. By this arrangement, when connecting the two cell units arranged parallely with the long sides of the two cell units matching each other, it is possible to easily connect the second electrodes on the respective cell units with the second inter connecter.

A third aspect of the present invention relates to a solar cell module.

The solar cell module according to this aspect has an arrangement of solar cells in a quadrangular shape and capable of forming a rectangular outline by matching oblique lines of the respective solar cells each other, wherein while combining one or more pairs of the solar cells each formed by matching the oblique lines each other, relevant solar cells are connected with a first inter connecter, thereby constructing a cell unit having an outline in one of a rectangular shape and a square shape, and while arranging the cell units along a pattern of electric connection of the solar cell module with one sides of the outlines in one of a rectangular shape and a square shape of the cell units respectively matching each other, relevant solar cells between predetermined adjacent cell units are connected with a second inter connecter.

In each of the above aspects, the "outline in one of a rectangular shape and a square shape" refers to outlines including a substantially rectangular shape and a substantially square shape. In other words, these words and terms indicate that an outline of a cell unit has a shape such that, when arranging the cell units, the cell units may be arranged with straight sides of respective solar cells in a cell unit matching each other.

Further, in each of the above aspects, it is not necessary to connect all of the cell units with the second inter connecter. In addition, cell units positioned at an outer peripheral portion of the solar cell module may be connected each other through a conductive foil disposed further outside from these cell units.

Moreover, in each of the above aspects, "pseudohexagon" refers to, in addition to a shape cut out according to a manner as shown in FIGS. 29A to 29C, a shape in which a part or entirety of arc in the cut out shape are replaced with a straight line, and a shape of the cut out shape with slight modification to sides and angles thereof.

Moreover, in each of the above aspects, the angled shape of each corner of the solar cell, which is formed by dividing the regular hexagon or the pseudohexagon, may be changed into other shape which has roundness, for example. That is, the angled shape of the corner of the solar cell may be changed into other shape which has roundness, for example. It is noted that an apex of a pseudohexagon means a position corresponding an apex of a regular hexagon.

BRIEF DESCRIPTION OF THE DRAWINGS

These and other objects and novel features of the present invention will become fully apparent from the following description of a specific embodiment thereof, with reference to accompanying drawings, in which:

FIG. 2A illustrates an example of producing divided cells according to the configuration example 1 of the embodiment of the present invention.

FIGS. 3A and 3B each illustrate an example of connection form between units according to the configuration example 1 of the embodiment of the present invention.

FIG. 22 illustrates the pattern of unit arrangement of FIG. 20 with inter connecters superposed thereon.

DESCRIPTION OF PREFERRED EMBODIMENTS

The following describes an embodiment of the present invention with reference to the appended drawings.

CONFIGURATION EXAMPLE 1

1. Configuration of Solar Cell

Figure 1:
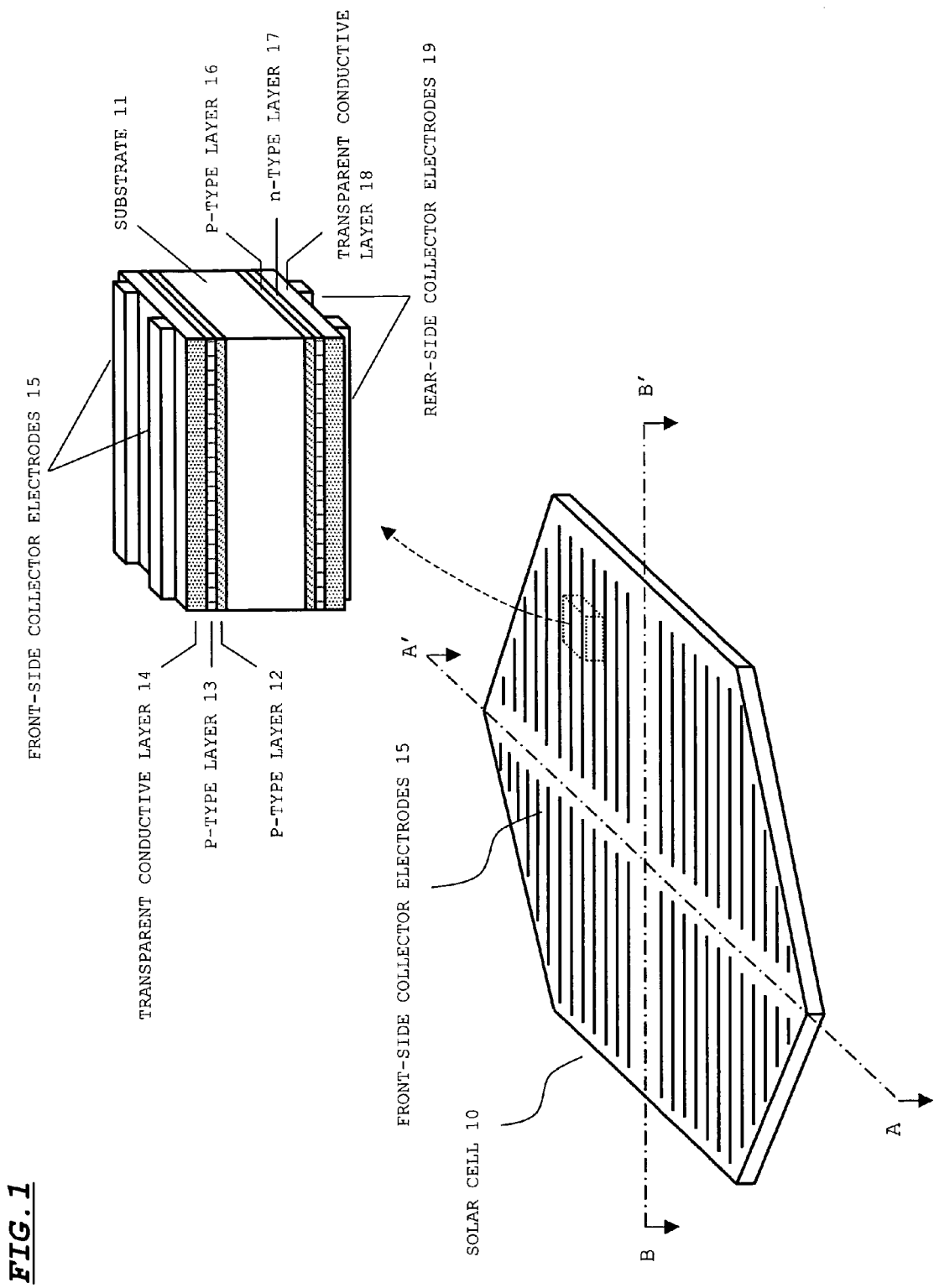
FIG. 1 illustrates a configuration of a solar cell according to a configuration example 1 of an embodiment of the present invention.

FIG. 1 illustrates a configuration of a solar cell before being divided into four pieces. As shown in the figure, a solar cell 10 is in a shape of a planer regular hexagon, and collector electrodes 15 and 19 are formed on a front surface and a rear surface, respectively, of the cell. Although not shown in FIG. 1, the solar cell 10 is also provided with electrodes (described later) respectively on the front surface and the rear surface, and these electrodes further collect photovoltaic current collected by the collector electrodes 15 and 19.

A cross-sectional configuration of the solar cell 10 is shown on the upper right of FIG. 1. As shown in this figure, the solar cell 10 includes a substrate 11, an i-type layer 12, a p-type layer 13, a transparent electrode film 14, the front-side collector electrode 15, an i-type layer 16, an n-type layer 17, a transparent conductive layer 18, and the rear-side collector electrode 19.

The substrate 11 is an n-type single crystal silicon substrate. On the front surface of the substrate 11, the i-type layer 12 made of intrinsic amorphous silicon and the p-type layer 13 made of p-type amorphous silicon are laminated in the stated order. Then, the transparent conductive layer 14 is laminated on the p-type layer 13, and the front-side collector electrode 15 in a pectinate shape is formed on the transparent conductive layer 14. On the other hand, on the rear surface of the substrate 11, the i-type layer 16 made of intrinsic amorphous silicon and the n-type layer 17 made of n-type amorphous silicon are laminated in the stated order. Then, the transparent conductive layer 18 is laminated on the n-type layer 17, and the rear-side collector electrode 19 in a pectinate shape is formed on the transparent conductive layer 18.

According to the solar cell 10 of this embodiment, light incident through both the front surface and the rear surface enters the substrate 11. Therefore, the photovoltaic current is generated regardless of which surface the light enters. The i-type layers 12 and 16 are about 100 Å thick. The p-type layer 13 and the n-type layer 17 are also about 100 Å thick. The transparent electrode films 14 and 18 are made of translucent material such as ITO, ZnO, and $SnO_2$. The front-side collector electrode 15 and the rear-side collector electrode 19 are made of, for example, electrically conductive material which is formed by baking such as a silver paste.

Figure 29B:
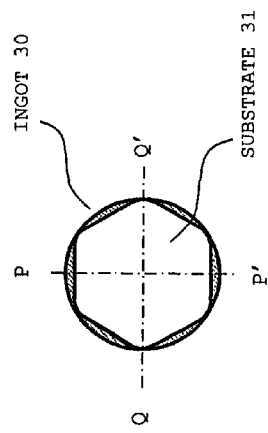
FIGS. 29A to 29C each illustrate a conventional example.

While the solar cell 10 illustrated in FIG. 1 is in the planer regular hexagon shape, the solar cell 10 may be in a shape of a pseudohexagon as shown in FIG. 29B. Further, a double-side light receiving solar cell may also be constituted only from one of the crystalline semiconductor material and the amorphous semiconductor material, other than the combination of the crystalline semiconductor material and the amorphous semiconductor material as described above.

The solar cell 10 as shown in FIG. 1 is divided by a straight line connecting two apexes (line A-A' in the drawing) and a straight line connecting two center points on two opposing sides (line B-B' in the drawing) into 4 trapezoidal parts. By combining these parts after the division, a cell unit is constructed (hereinafter referred to as "unit").

2. Configuration of Unit

Figure 2B:
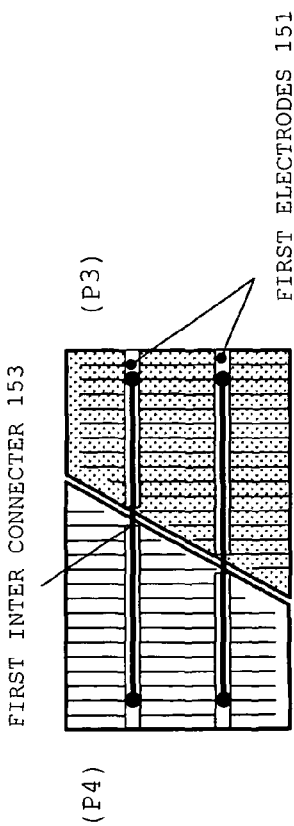
FIGS. 2B and 2C each illustrate a configuration example of a unit according to the configuration example 1 of the embodiment of the present invention.
Figure 2C:
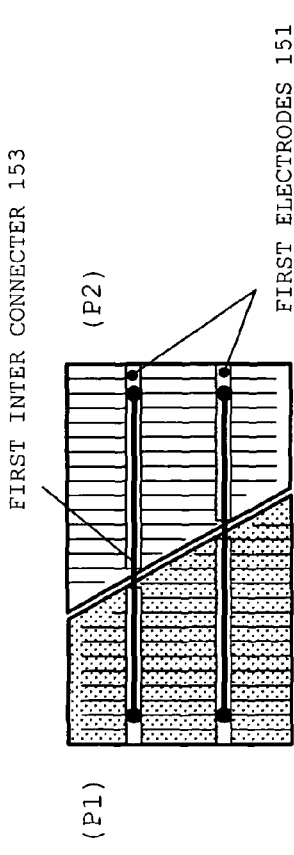

FIGS. 2A to 2C illustrate a pattern for dividing the solar cell 10 and a configuration example of a unit.

As shown in FIG. 2A, the solar cell 10 has first electrodes 151 respectively formed at corresponding positions of the front surface and the rear surface. Among these first electrodes 151, the first electrodes 151 disposed on the front surface are electrically connected to the front-side collector electrode 15. The first electrodes 151 disposed on the rear surface are provided in parallel with the first electrodes 151 on the front surface, and are electrically connected to the rear-side collector electrode 19.

This solar cell 10 is, as described above, divided by the line A-A' and the line B-B' into four parts (P1 to P4). The division is conducted using such as a laser cutter or scriber. Although the first electrodes 151 are each configured so as to extend continuously from one end to the other end of the solar cell 10 in FIG. 2A, the first electrodes 151 may be divided into a left-side part and a right-side part so that each electrode includes a gap at a position corresponding to the line B-B' in the drawing. With this configuration, it is possible to facilitate the division of a cell by the line B-B'.

The parts that are divided in the above manner are unitized as shown in FIGS. 2B and 2C, for example. In FIG. 2B, a part P1 is combined with a part P2, with a front surface and a rear surface of the part in an inversed state. In FIG. 2C, a part P3 is combined with a part P4, with a front surface and a rear surface of the part in the inversed state. When unitized, oblique lines of the respective parts are made to match without misalignment. With this-configuration, two of the first electrodes 151 respectively disposed on the front surface of one part and the rear surface of the other part are aligned along a single straight line. In other words, the first electrodes 151 are formed on the front surface and the rear surface of the solar cell 10 before the division so that the first electrodes 151 are aligned along the single straight line when unitized as shown in FIGS. 2B and 2C. The first electrodes 151 on the front surface are formed, for example, integrally and simultaneously with the front-side collector electrode 15. Further, the first electrodes 151 on the rear surface are formed, in the same manner, integrally and simultaneously with the rear-side collector electrode 19.

After that, the first electrodes that are on the same side in such a state of combination, namely, the first electrodes 151 on the front surface of the part P2 (P4) and the first electrodes 151 on the rear surface of the part P1 (P3) are connected with first inter connecters 153. By this, a unit in a substantially rectangular shape is constructed, and the unitization of the respective parts is completed. The first inter connecters 153 are made of such as a copper tab that has gone through solder dip, and connected electrically to the electrodes by molten soldering when heated.

In the example shown in FIGS. 2A to 2C, the part P1 and the part P3 are turned around into an inversed state to be utilized as parts for rear surface arrangement. However, it is possible to produce the solar cell 10 for front surface arrangement and the solar cell 10 for the rear surface arrangement, and divide each cell into four pieces as shown in FIGS. 2A to 2C. The respective divided pieces, then, may be used as parts for the front surface arrangement and parts for the rear surface arrangement.

3. Connection Form Between Units

FIGS. 3A to 3B illustrate a connection form between two units configured as above that are electrically connected by aligning to form a rectangle in a straight line. FIG. 3A is a top view of the two units, and FIG. 3B is a sectional view of the two units taken at a line C-C' in FIG. 3A. Hereinafter, a part that is used without turned around is referred to as "divided cell 10a", and a part turned around and used in the inversed state as "divided cell 10b".

In this connection form, the two units are connected in the following procedures. First, the two units are arranged in a straight line. At this time, short sides to be connected of the two units are made to match without misalignment with the surfaces of the two divided cells to be connected are inversed to each other. Then, the first electrodes 151 on the same side of the two divided cells to be connected are connected with second inter connecters 154. In the example of FIGS. 3A to 3B, the two units are electrically connected on the rear side. The second inter connecters 154 are, similarly to the first inter connecters, made of such as a copper tab that has gone through solder dip, and connected electrically to the electrodes by molten soldering when heated.

When arranging the units, a row of units that are serially connected may be produced in a serial connection, in advance, by a length corresponding to a line of serial connection in the pattern of electrical connection as shown in FIG. 3A, and then, may be arranged at a position along the pattern of electrical connection. By this, it is possible to improve the workability in the arrangement of the units.

Figure 4B:
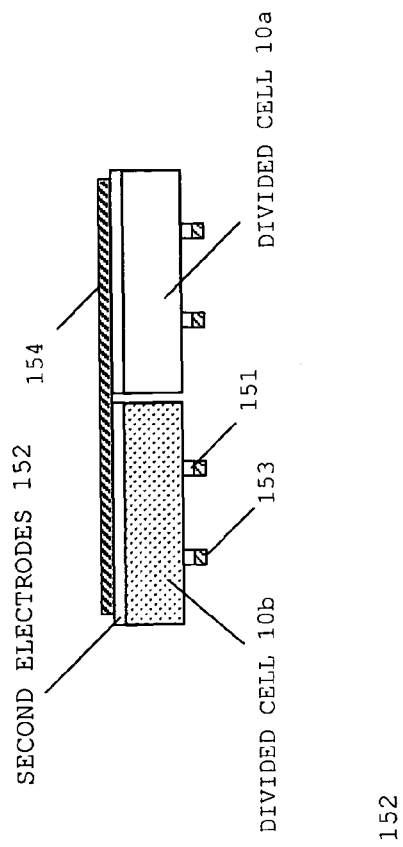
FIGS. 4A to 4D each illustrate an example of connection form between the units according to the configuration example 1 of the embodiment of the present invention.
Figure 4A:
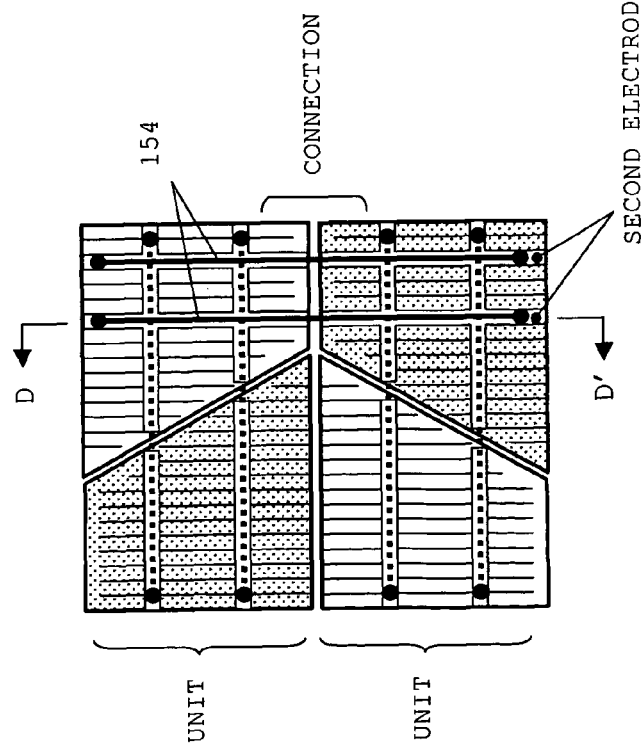

FIGS. 4A and 4B illustrate a connection form when the two units are electrically connected in series by arranging the two units in parallel. FIG. 4A is a top view of the two units and FIG. 4B is a sectional view of the two units taken at a line D-D' in FIG. 4A. In this case, the divided cells that are connected between the units are provided with second electrodes 152 that are joined to the first electrodes 151 and extend perpendicularly from the first electrodes 151, as shown in FIG. 4A. The second electrodes 152 may be disposed on only one of the front surface and the rear surface, on which the electrodes are connected with the second inter connecters 154, of the two divided cells. However, the second electrodes 152 are, typically (preferably), formed on the rear side of a unit.

Figure 9A:
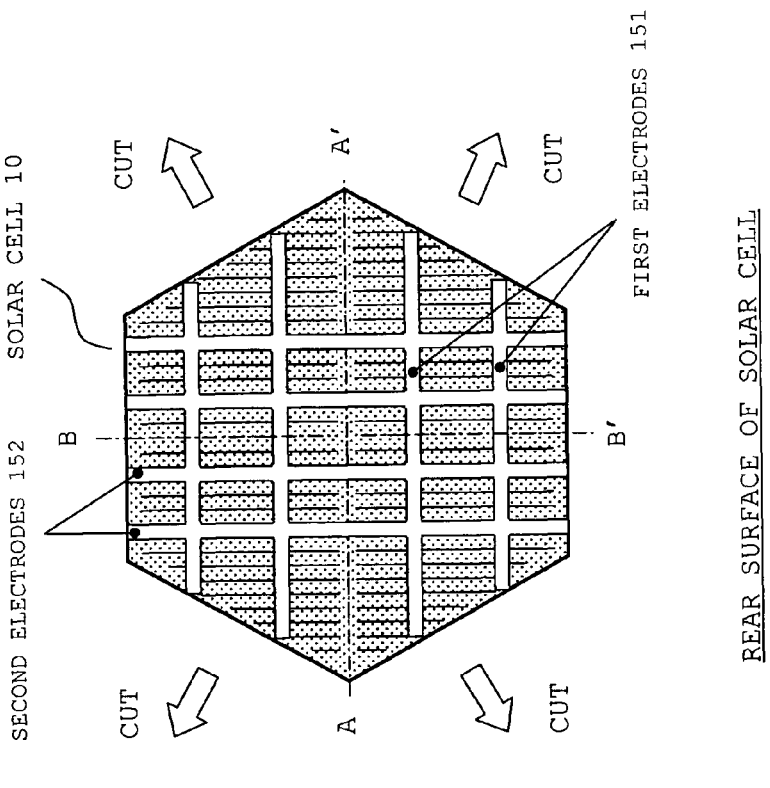
FIGS. 9A and 9B each illustrate an example of producing divided cells according to the configuration example 1 of the embodiment of the present invention.
Figure 9B:
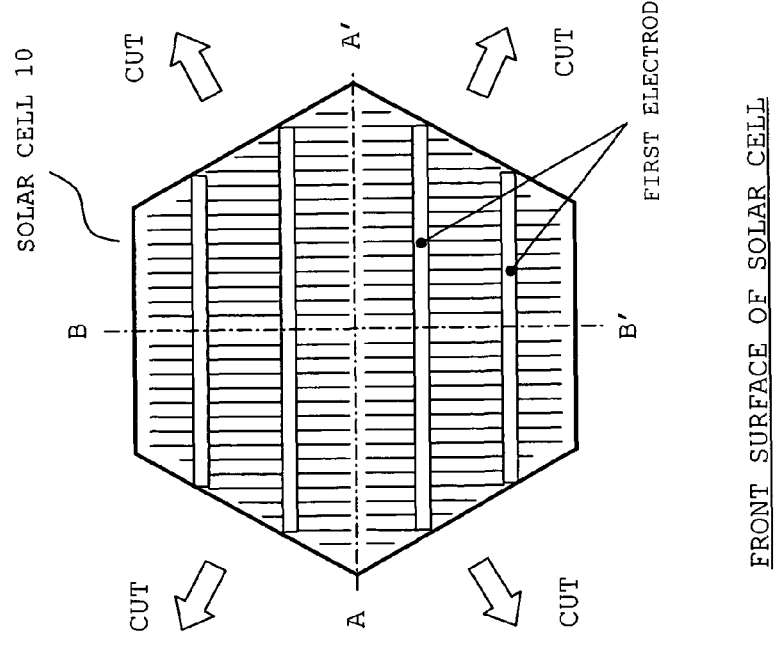

As described above, the divided cells having the second electrodes 152 on one surface are produced by dividing the solar cell 10 provided with the second electrodes 152 on one surface by the line A-A' and the line B-B', as shown in FIG. 9, for example. FIG. 9 illustrates a case in which the second electrodes 152 are formed on the rear side. Although the first electrodes 151 and the second electrodes 152 are each configured so as to extend continuously from the one end to the other end of the solar cell 10 in FIG. 9, the first electrodes 151 and the second electrodes 152, respectively, may be divided at positions corresponding to the line B-B' and the line A-A' into left parts and right parts, and upper parts and lower parts, respectively, so that gaps are provided at the corresponding positions. By this, it is possible to facilitate the division of the cells by the line B-B' and the line A-A'.

Referring back to FIGS. 4A and 4B, when making such a connection, long sides to be connected in the two respective units are made to match each other without misalignment with the two divided cells to be connected in the inversed state. With this arrangement, the two second electrodes 152 disposed on either the front surface or the rear surface of the divided cells of the respective units are aligned along a single straight line. Then, the second electrodes 152 on the same side of the two divided cells to be connected are connected with the second inter connecters 154. In the example of FIGS. 4A and 4B, the two units are electrically connected on the front side.

Figure 4D:
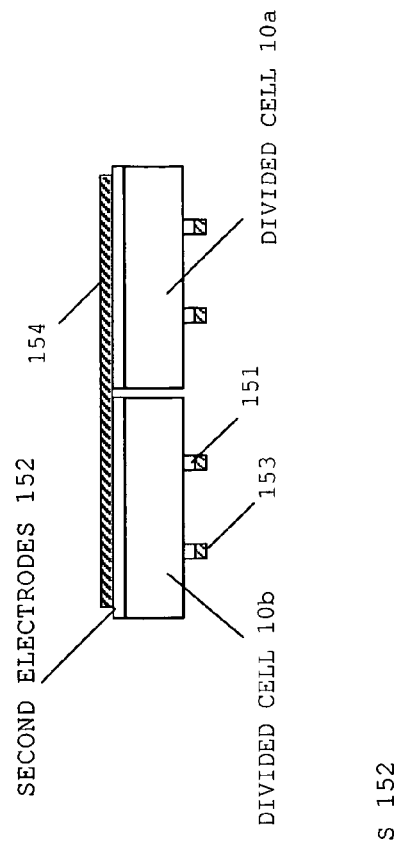
Figure 4C:
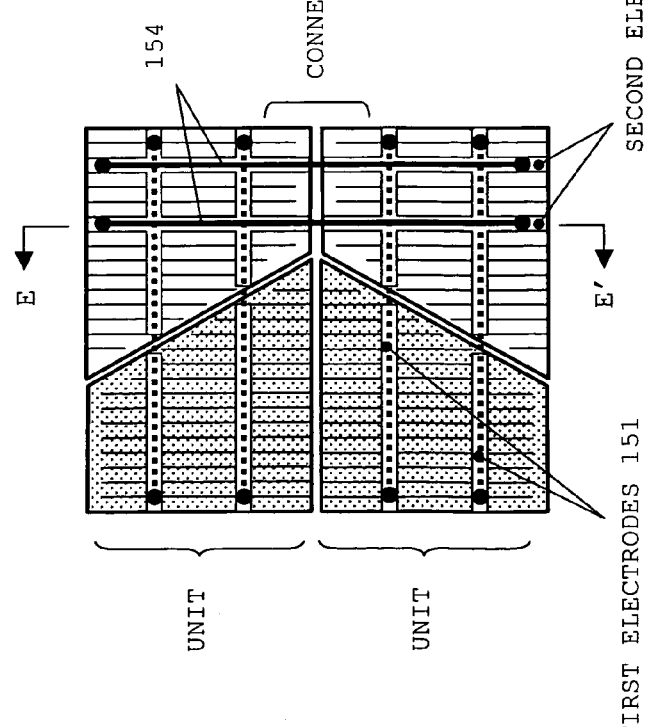

FIGS. 4C and 4D illustrate a connection form in which the two units are arranged in parallel and electrically connected in parallel. FIG. 4C is a top view of the two units, and FIG. 4D is a sectional view taken at a line E-E' of FIG. 4C. In this case, similarly to the above cases, the divided cells that are connected between the units are provided with the second electrodes 152. Also in this case, the second electrodes 152 may be disposed on only one of the front surface and the rear surface, on which the electrodes are connected with the second inter connecters 154, of the two divided cells.

When making the connection between the units as shown in FIGS. 4A to 4D, the long sides to be connected of the two units are made to match without misalignment with the surfaces of the two divided cells to be connected are aligned on the same side. With this configuration, the two second electrodes 152 disposed on the front surface or the rear surface of the divided cells of the respective units are aligned in a single straight line. Then, the second electrodes 152 of the two divided cells to be connected on the same side are connected with the second inter connecters 154. In the example of FIGS. 4C and 4D, the two units are electrically connected on the front side.

It should be noted that not all of the divided cells should necessarily include the second electrodes 152 on the rear surface as described above. It is possible to use such divided cells only at ends of the arrangement. Further, the divided cells at the ends are connected using a connecting member separate from the divided cells, instead of using the second electrodes 152. For example, in FIG. 4C, the connecting member may be arranged so as to be positioned away from the right side of a unit at a certain distance, and the first electrodes 151 on the divided cell on the right side of each unit may be connected to the connecting member with the inter connecters.

CONFIGURATION EXAMPLE 2

1. Configuration of Solar Cell

Figure 5:
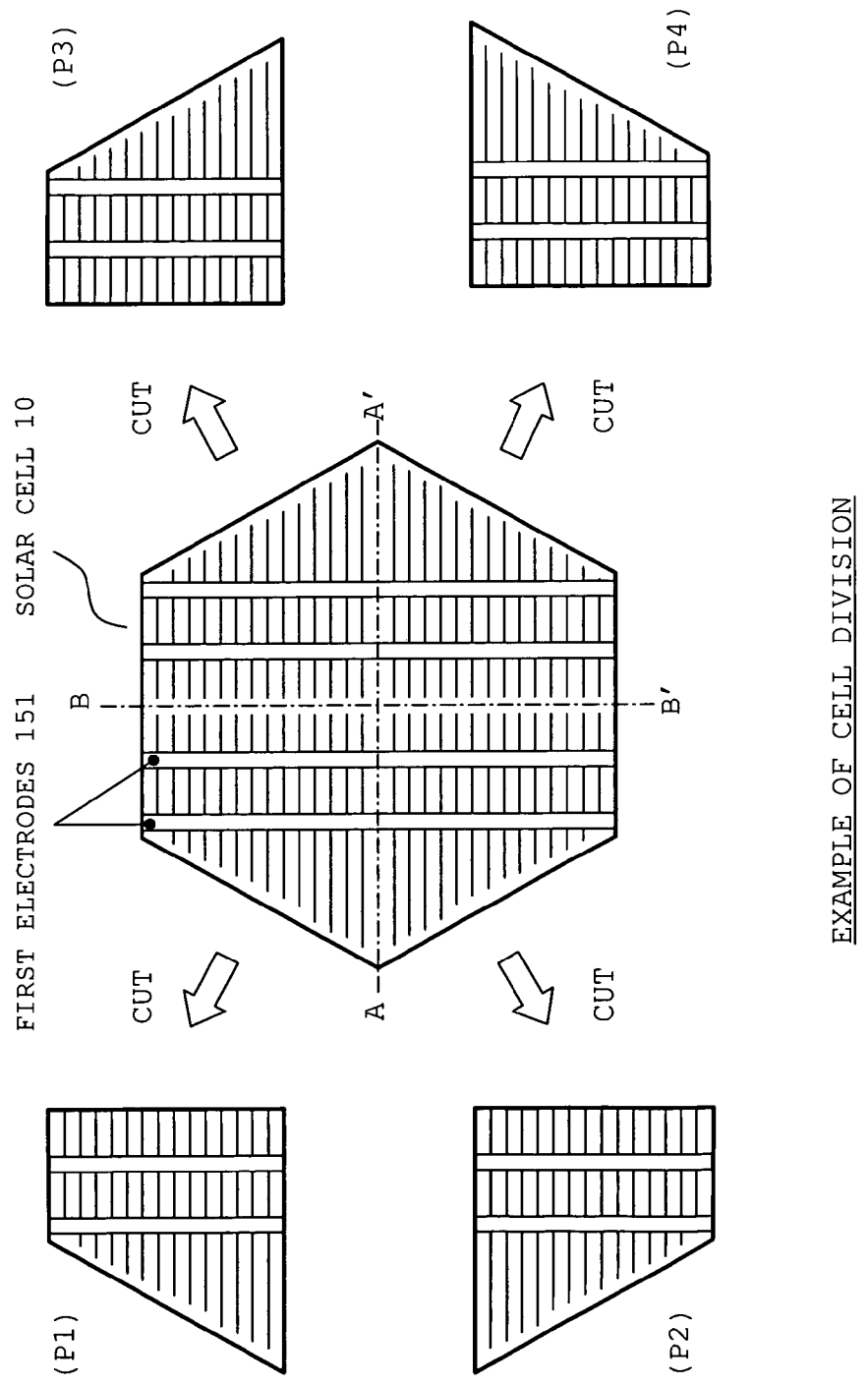
FIG. 5 illustrates a configuration example of divided cells according to a configuration example 2 of the embodiment of the present invention.

FIG. 5 illustrates another configuration example of a solar cell and a divided cell. The structure of the layers in this solar cell is the same as the structure shown in FIG. 1, other than the direction of arrangement of the collector electrode 15. According to this configuration example, the front-side collector electrode 15 and the rear-side collector electrode 19 extend in a direction perpendicular to the extension direction in the case of FIG. 1 (A-A' in FIG. 5). Further, the first electrodes 151 are configured to be electrically connected to the front-side collector electrode 15 and the rear-side collector electrode 19. Although the first electrodes 151 are each configured so as to extend continuously from the one end to the other end of the solar cell 10 in FIG. 5, the first electrodes 151 may be divided at positions corresponding to the line A-A' into an upper part and a lower part, so that gaps are provided at the positions corresponding to the line A-A'. With this configuration, it is possible to facilitate the division of the cells by the line A-A'. The division of the solar cell 10 is conducted in the same way as the above case of the configuration example 1 shown in FIGS. 2A to 2C.

2. Configuration of Unit

Figure 6B:
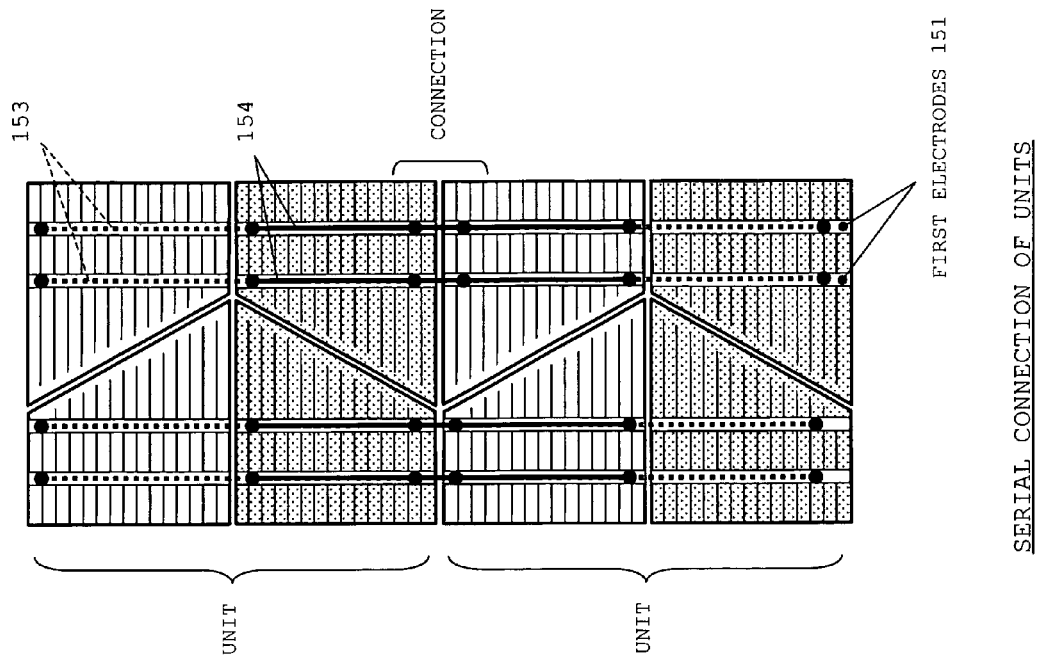
FIGS. 6A and 6B respectively illustrate a configuration example of a unit and an example of connection form between units according to the configuration example 2 of the embodiment of the present invention.
Figure 6A:
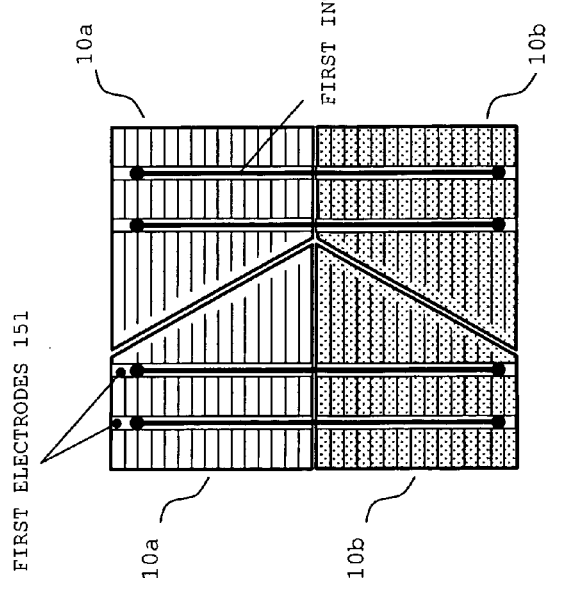

FIG. 6A illustrates a configuration example of a unit when using such divided cells.

According to this configuration example, four divided cells constitute a unit. Specifically, two divided cells 10a and 10a that are not in the inversed state are paired by matching the oblique lines of the respective cells each other without misalignment, and at the same time, two divided cells 10b and 10b in the inversed are also paired by matching the oblique lines of the respective cells each other without misalignment. Then, with the long sides of the respective pair matching each other without misalignment, the first electrodes 151 of the corresponding divided cells are connected with the first inter connecters 153. By this, a unit in a substantially square shape is constructed, and unitization of the respective divided cells is completed.

3. Connection Form between Units

FIG. 6B illustrates a connection form in which two units constructed as above are connected in series by arranging the units in the same direction as the direction of connection between the divided cells in the unit.

At a position of "connection" shown in FIG. 6B, the two units are connected serially. In this case, sides to be connected of the two respective units are made to match each other without misalignment with the two divided cells to be connected between the units in the inversed state. With this configuration, two of the first electrodes 151 respectively disposed on the front surface and the rear surface of the respective divided cells of the units are aligned along a single straight line. Then, the first electrodes 151 on the same side of the two divided cells to be connected are connected with second inter connecters 154. In the example of FIG. 6B, the two units are electrically connected on the front side.

When arranging the units, a strip of units that are serially connected may be produced, in advance, by a length corresponding to a line of continuous connection in the pattern of electrical connection with the serial connection as shown in FIG. 6B, and then, may be arranged at a position along the pattern of electrical connection. By this, it is possible to improve the workability in the arrangement of the units.

Figure 7:
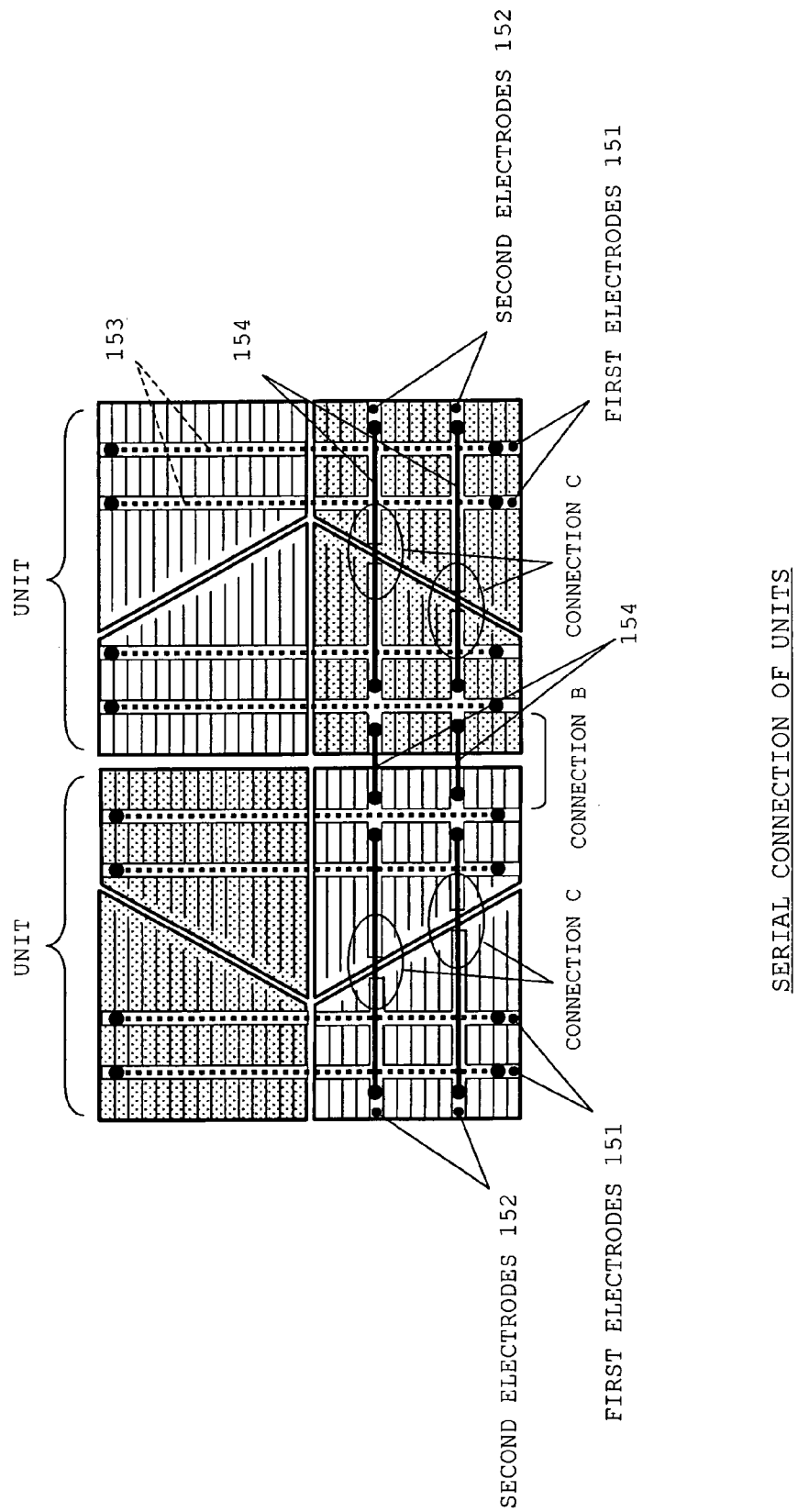
FIG. 7 illustrates an example of connection form between the units according to the configuration example 2 of the embodiment of the present invention.

FIG. 7 illustrates a connection form when the units shown in FIG. 6A are connected in series by arranging the units in a direction perpendicular to the direction of connection between the divided cells in the unit. At "connection B" in FIG. 7, the two units are serially connected with the second inter connecters 154.

In this case, the two divided cells in the unit are connected in parallel with the second inter connecters 154 at a position of "connection C" shown in FIG. 7. The divided cells that are connected in the unit, as shown in FIG. 7, are provided with the second electrodes 152 joining to the first electrodes 151 and extending perpendicularly to the first electrodes 151. The second electrodes 152 may be disposed on only one of the front surface and the rear surface, on which the electrodes are joined with the second inter connecters 154, of the two divided cells.

Figure 10A:
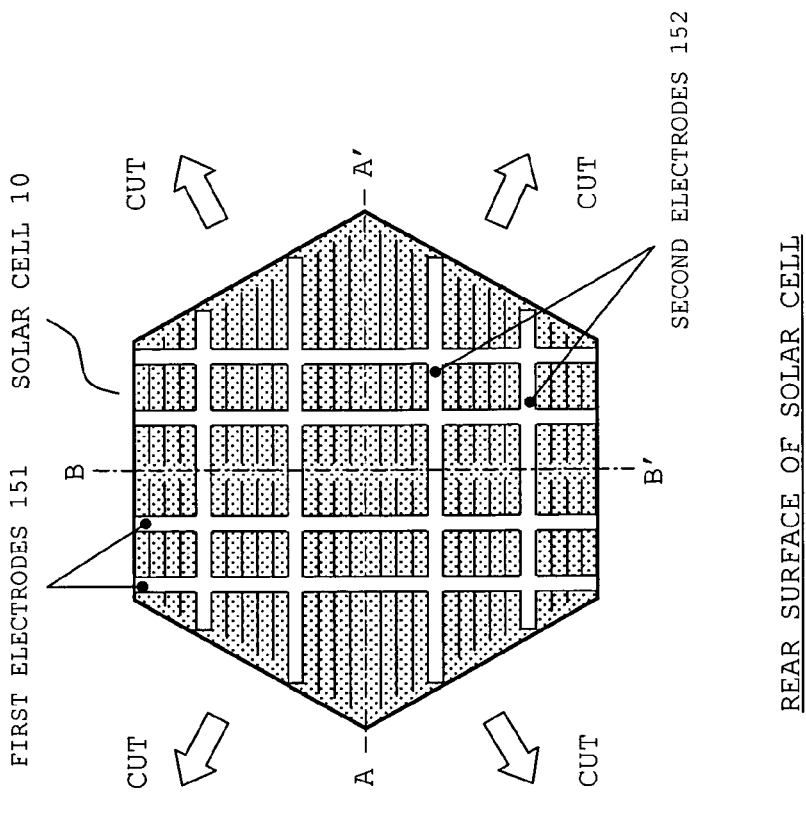
FIGS. 10A and 10B each illustrate an example of producing divided cells according to the configuration example 2 of the embodiment of the present invention.
Figure 10B:
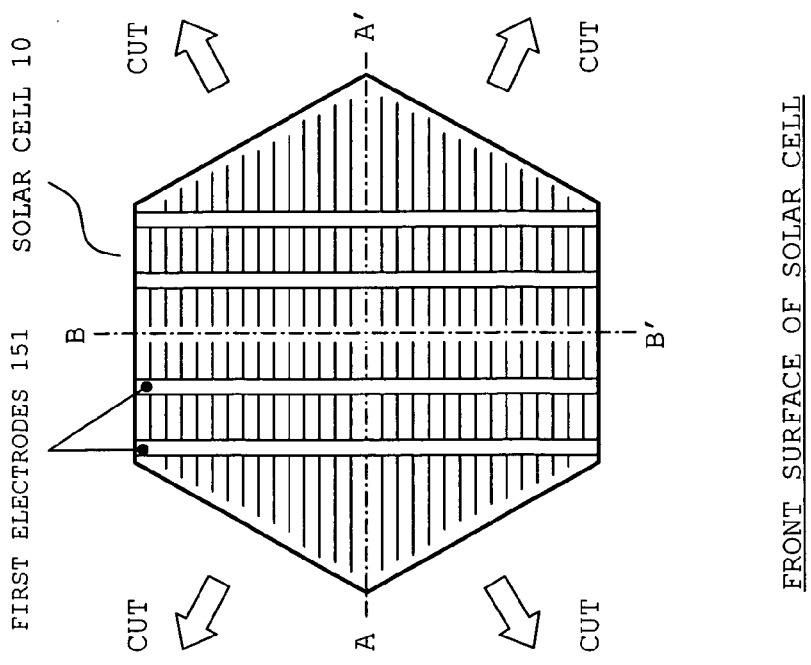

As described above, the divided cells having the second electrodes 152 on one surface are produced preferably by, for example, dividing the solar cell 10 provided with the second electrodes 152 on one surface with the line A-A' and the line B-B', as shown in FIG. 10. FIG. 10 illustrates a case in which the second electrodes 152 are formed on the rear side. Although the first electrodes 151 and the second electrodes 152 are each configured so as to extend continuously from the one end to the other end of the solar cell 10 in FIG. 10, the first electrodes 151 and the second electrodes 152, respectively, may be divided at the positions corresponding to the line A-A' and the line B-B' into upper parts and lower parts, and left parts and right parts, so that gaps are provided at the positions corresponding to the line A-A' and the line B-B'. By this, it is possible to facilitate the division of the cells by the line B-B' and the line A-A'.

Referring back to FIG. 7, when serially connecting the two units, the connecting sides in the two respective units are made to match each other without misalignment with the two divided cells to be connected in the inversed state. With this configuration, the two second electrodes 152 disposed on the front surface or the rear surface of the divided cells of the respective units are aligned along a single straight line. Then, the second electrodes 152 on the same side of the two divided cells to be connected are connected with the second inter connecters 154. In the example of FIG. 7, the two units are electrically connected on the front side.

Figure 8:
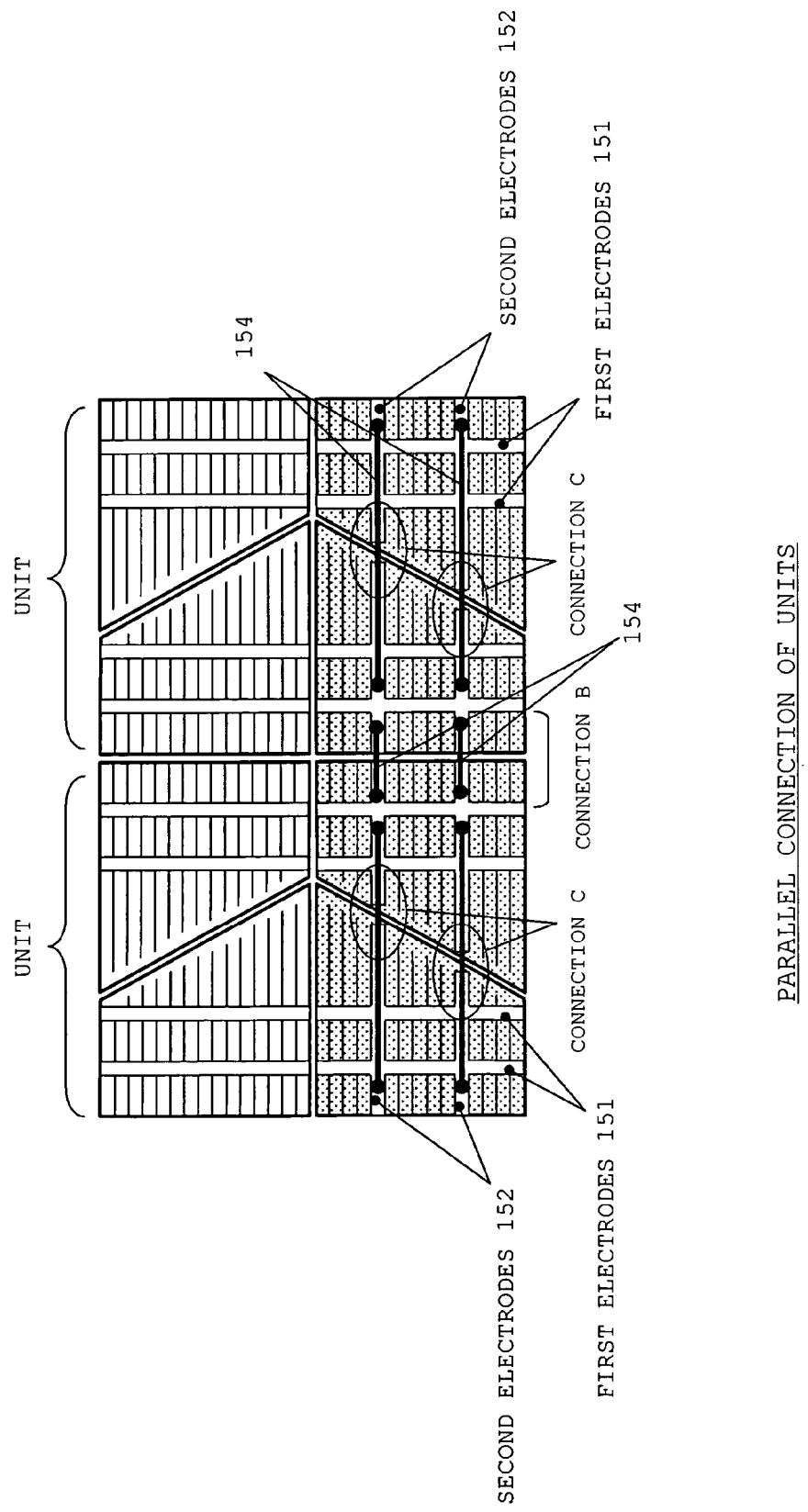
FIG. 8 illustrates an example of connection form between the units according to the configuration example 2 of the embodiment of the present invention.

FIG. 8 illustrates a connection form when the units shown in FIG. 6A are connected in parallel by arranging the units in a direction perpendicular to the direction of connection between the divided cells in the unit. At the position of "connection B" in FIG. 8, the two units are connected in parallel with the second inter connecters 154.

In this case, similarly to the case of FIG. 7, the two divided cells in the unit are connected in parallel at the position of "connection C". Then, the connecting sides of the two units are made to match without misalignment so that the surfaces of the two divided cells to be connected are aligned. After that, the second electrodes 152 on the same side of the two divided cells to be connected are connected using the second inter connecters 154. In the example of FIG. 8, the two units are electrically connected on the front side.

As described above, the arrangement of the divided cells and the configuration of the unit using such divided cells are explained. However, an arrangement of the cells other than the described arrangement may be employed.

For example, although the numbers of the first electrodes 151 and the second electrodes 152 provided on each divided cell are each two in the above configuration examples 1 and 2, the numbers of the electrodes are not limited to this. The number of each type of the electrodes may be modified appropriately in view of an optical design and such.

Further, the first electrodes 151 in the configuration example 1 do not necessarily face in parallel on the front surface and the rear surface. Likewise, the first electrodes 151 in the configuration example 2 do not necessarily face in parallel on the front surface and the rear surface.

Figure 11B:
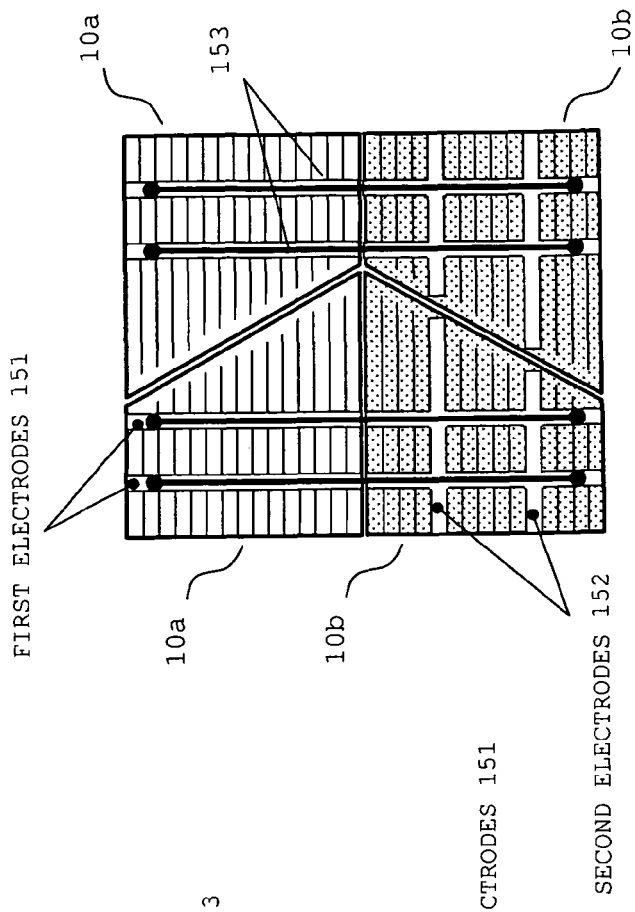
FIGS. 11A and 11B each illustrate a configuration example of a unit using different divided cells from the configuration examples 1 and 2 of the embodiment of the present invention.
Figure 11A:
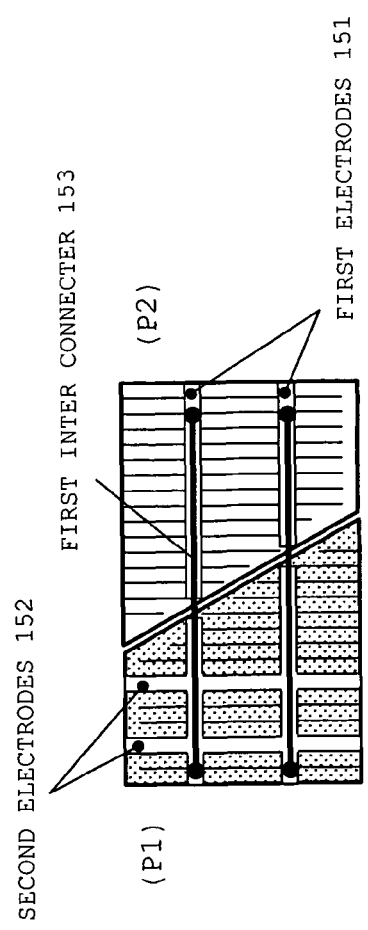

According to the above configuration example 1, when arranging the units shown in FIG. 3A in serial, the units constituted from the divided cells without the second electrodes 152 are arranged. In this case, as shown in FIG. 11A, the units may be constituted by using the divided cells further having the second electrodes 152 (FIG. 9). However, this reduces an output efficiency of the divided cells by the amount of light shielded by the second electrodes 152. Therefore, when serially connecting in such a manner, it is preferable to constitute the unit from the divided cells without the second electrodes 152 as shown by the above configuration example 1.

Likewise, according to the above configuration example 2, when arranging the units shown in FIG. 6B in serial, the units constituted from the divided cells without the second electrodes 152 are arranged. In this case, as shown in FIG. 11B; the units may be constituted by using the divided cells further having the second electrodes 152 (FIG. 10). However, similarly to the above case, this also causes the light to be shielded by the second electrodes 152, and reduces the output efficiency of the divided cells. Therefore, when serially connecting in such a manner, it is preferable to constitute the unit from the divided cells without the second electrodes 152 as shown by the above configuration example 2.

Moreover, the directions of the collector electrodes 15 and 19 on the front surface and the rear surface in the configuration examples 1 and 2 may not have to be the same as in FIGS. 2A to 2C or FIG. 5, and may be in a grid pattern or in a diagonal direction.

UNIT ARRANGEMENT EXAMPLE

The following describes an example of arrangement of the units constituted as described above. Hereinafter, the divided cells that are shown white are the divided cells not in the inversed state, and the divided cells that are shown black hatched are the divided cells in the inversed state.

Figure 12:
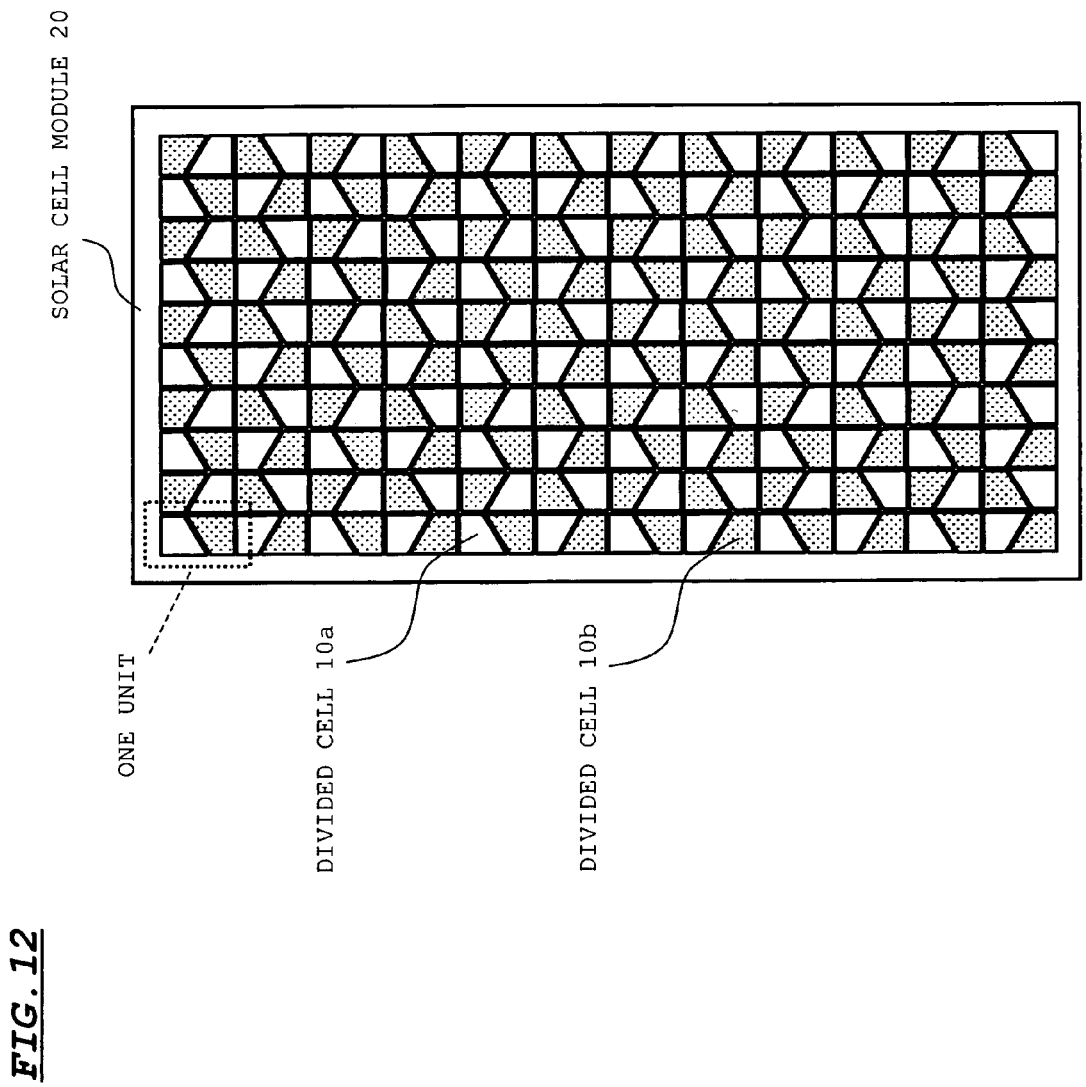
FIG. 12 illustrates an example of unit arrangement according to the embodiment of the present invention.

FIG. 12 illustrates an example of arrangement of the units in a solar cell module. In FIG. 12, a unit is constituted from two divided cells. Here, the units are constructed as shown in FIGS. 2B and 2C. The units are electrically connected as described above by arranging the units on a solar cell module 20 with making the short sides or the long sides to match each other, according to a pattern of electrical connection. By this, it is possible to construct the solar cell module capable of collecting photovoltaic current from the cells to generate power.

The solar cell module may be constructed, for example, such that a plate-like structure is constructed by arranging the units between a transparent front surface cover made of such as tempered solar glass and a weathering rear surface cover made of a resin film such as polyethylene terephthalate (PET) through a filling material such as Ethylene Vinyl Acetate (EVA), then a metal frame made of aluminum and such is attached to the plate-like structure.

Figure 13:
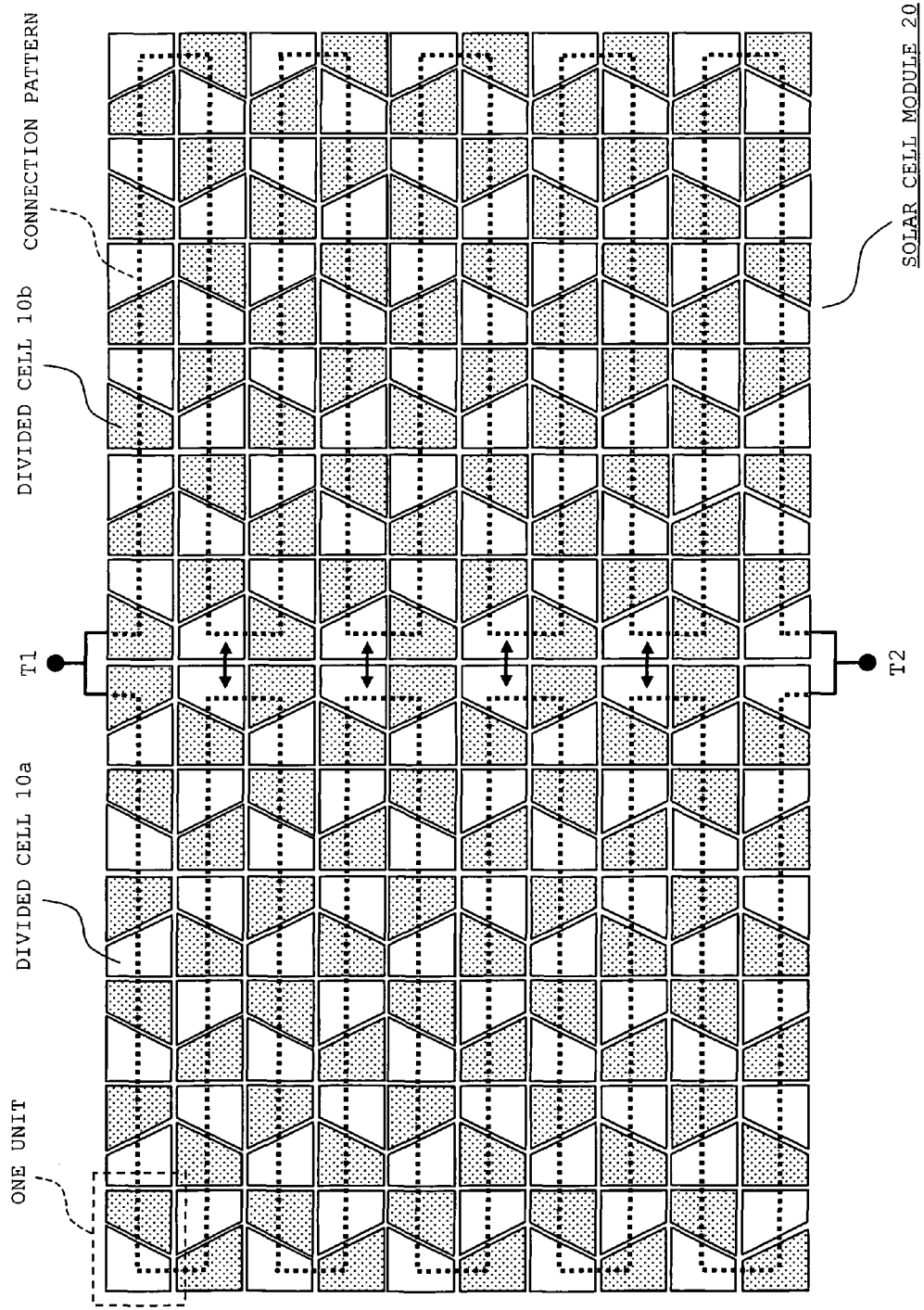
FIG. 13 illustrates patterns of electrical connection and unit arrangement according to the embodiment of the present invention.

FIG. 13 illustrates a pattern of electrical connection and a pattern of the unit arrangement corresponding to the connection pattern. According to this example of the patterns, the divided cells on the connection pattern shown by the dotted line in the drawing are sequentially connected in serial. With this, a parallel connection pattern is realized in which the pattern is divided into two parts, right and left, at the center. In the drawing, T1 and T2 respectively indicate minus and plus output terminals. In this pattern, the connection patterns come closer at positions indicated by arrows in the drawing. Therefore, it is possible to easily connect a bypass diode for preventing application of a reverse voltage to this position.

Figure 14:
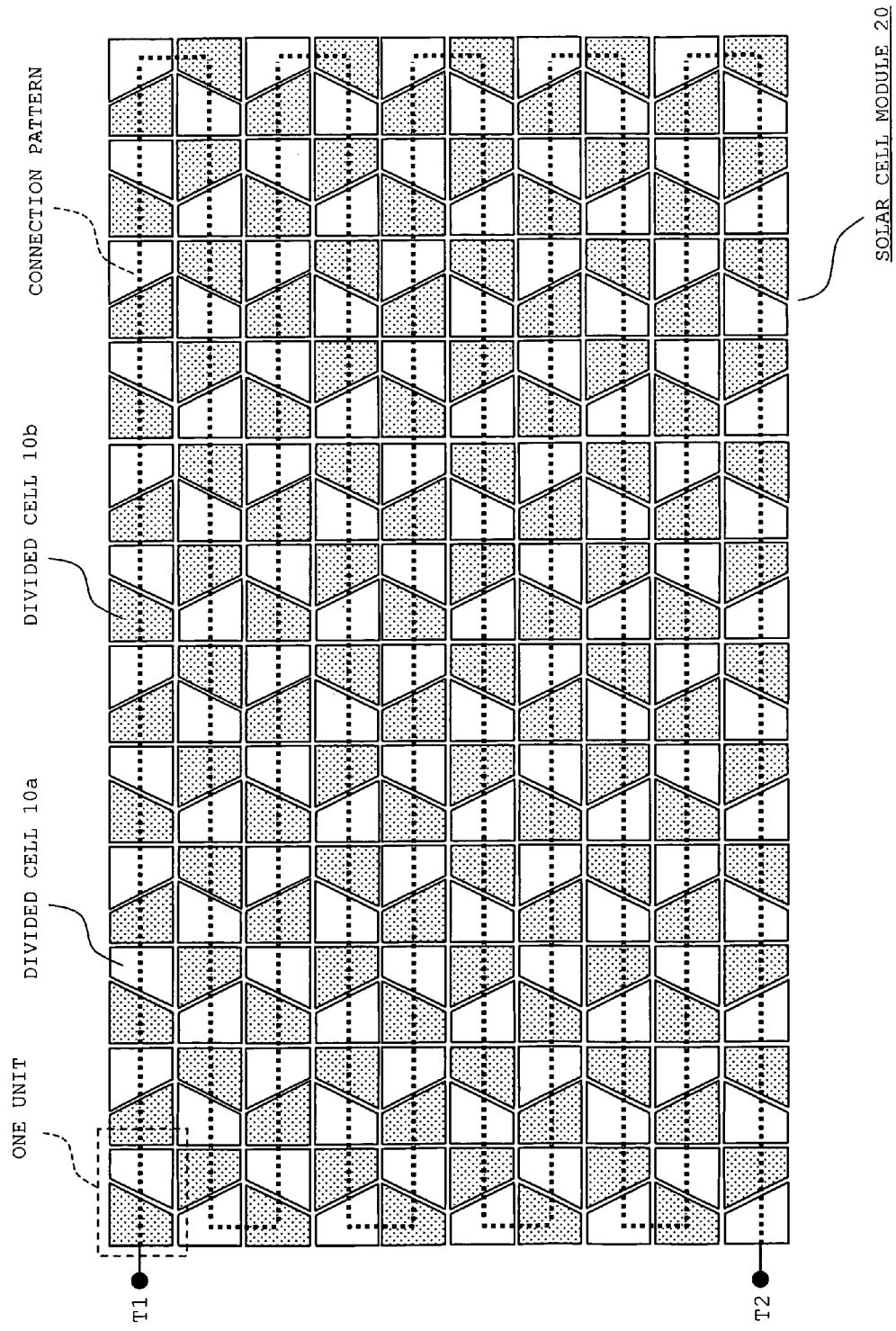
FIG. 14 illustrates different patterns of electrical connection and unit arrangement of the present invention.

FIG. 14 illustrates another pattern of electrical connection and a pattern of the unit arrangement corresponding to the connection pattern. According to this example of the pattern, the divided cells on the connection pattern shown by the dotted line in the drawing are sequentially connected in serial. With this, the serial connection pattern is realized in which all the divided cells are sequentially connected in serial. In this pattern, it is possible to pull out the output terminals T1 and T2 from the same side (short side) of the solar cell module, and therefore an arrangement of a terminal box may be facilitated.

Figure 15:
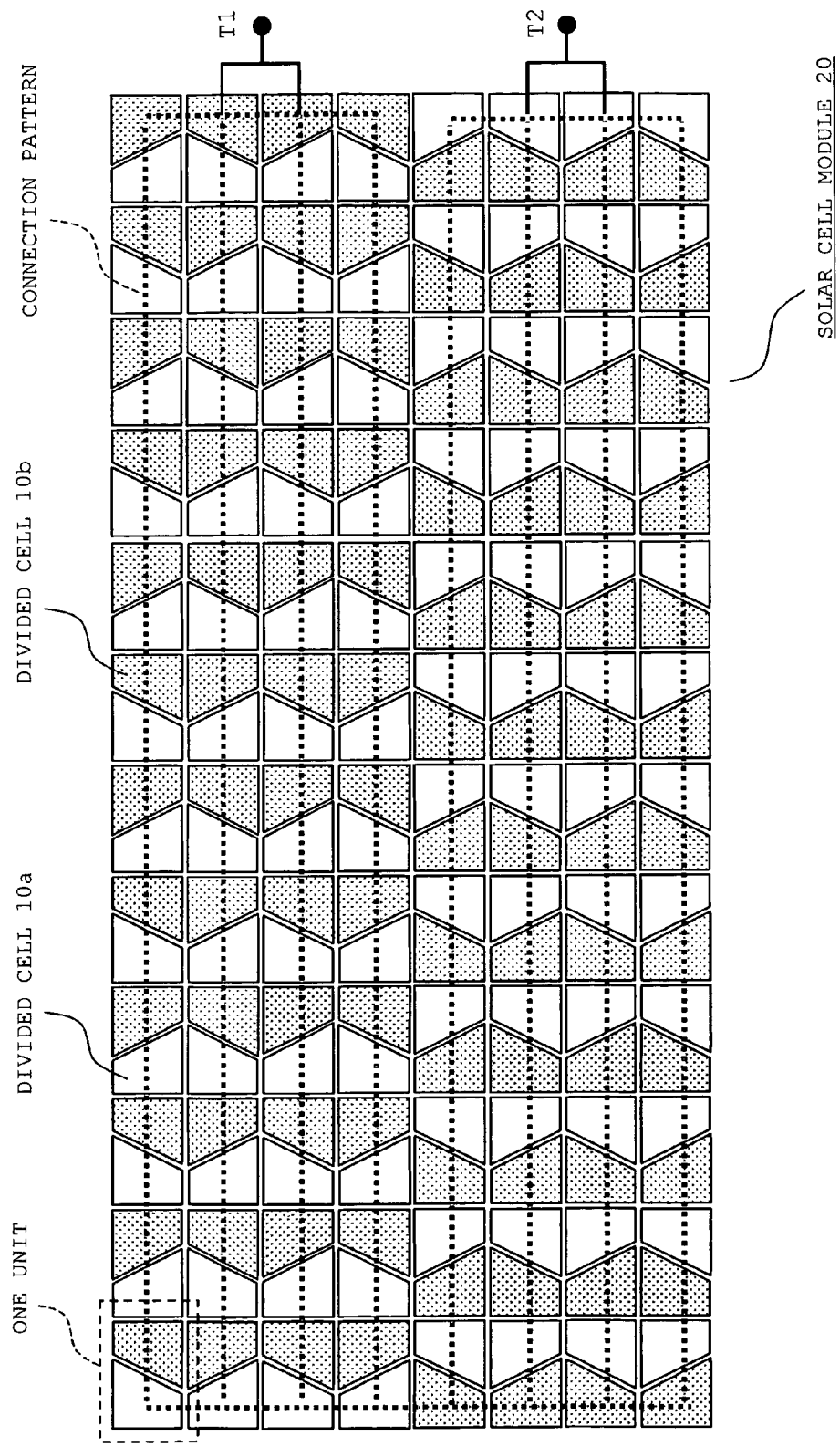
FIG. 15 illustrates different patterns of electrical connection and unit arrangement of the present invention.

FIG. 15 illustrates yet another pattern of electrical connection and a pattern of the unit arrangement corresponding to the connection pattern. According to this example of the pattern, two adjacent divided cells that are in the inversed state to each other out of the divided cells on the connection pattern shown by the dotted line in the drawing are sequentially connected in serial, and two adjacent divided cells that are on the same side to each other are connected in parallel. With this, a 4-parallel connection pattern is realized in which the pattern is divided into two parts, upper and lower, at the center. In this pattern, it is possible to make the output terminals T1 and T2 come even closer than in the case of FIG. 14, and therefore the arrangement of the terminal box may be further facilitated.

Figure 16:
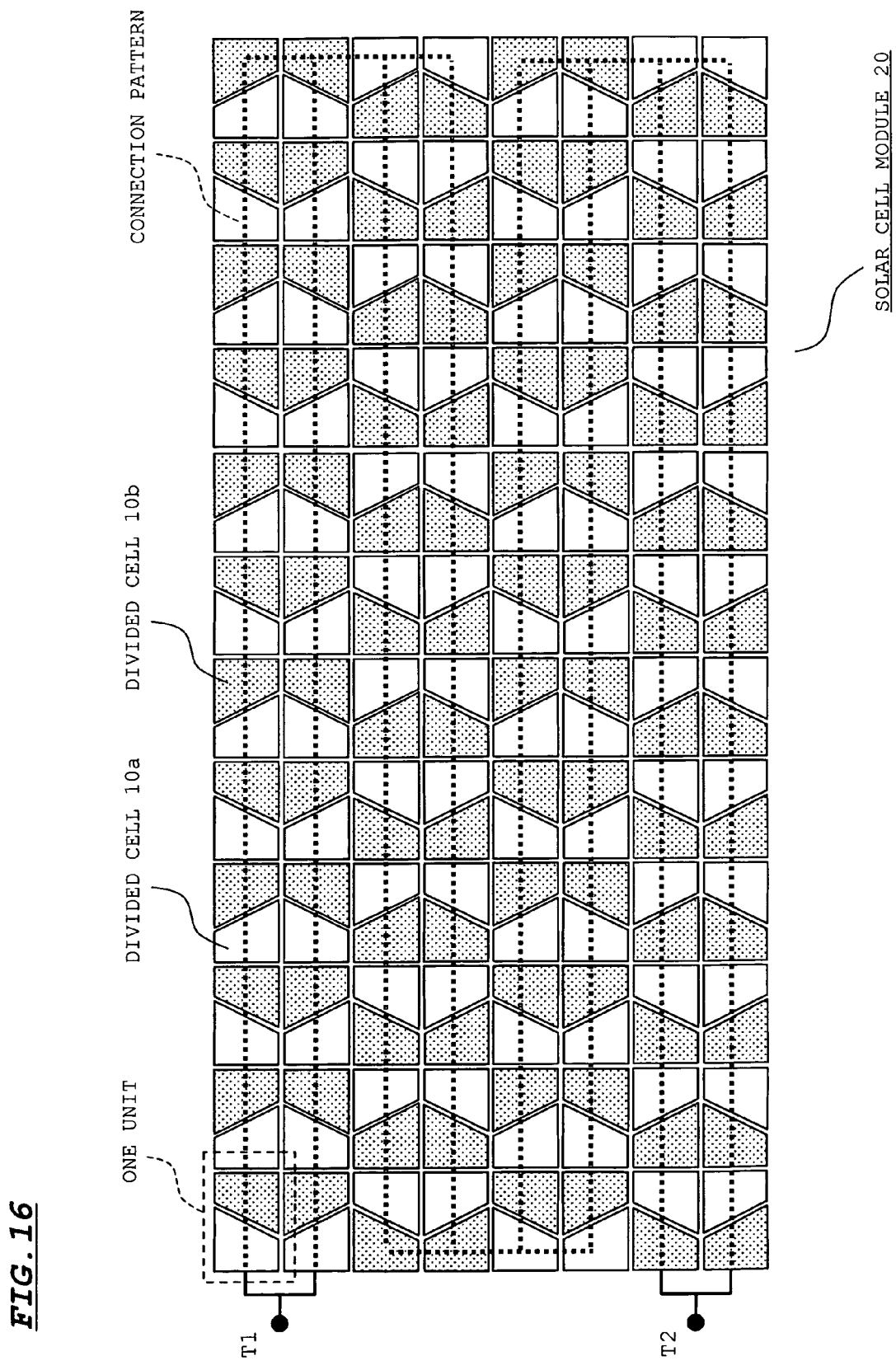
FIG. 16 illustrates different patterns of electrical connection and unit arrangement of the present invention.

FIG. 16 illustrates yet another pattern of electrical connection and a pattern of the unit arrangement corresponding to the connection pattern. According to this example of the pattern, two adjacent divided cells that are in the inversed state to each other out of the divided cells on the connection pattern shown by the dotted line in the drawing are sequentially connected in serial, and two adjacent divided cells that are on the same side to each other are connected in parallel. With this, a 2-parallel connection pattern is realized in which the units are connected in parallel by two rows. Also in this pattern, as in the above case of FIG. 14, it is possible to pull out the output terminals T1 and T2 from the same side (short side) of the solar cell module, and therefore the arrangement of the terminal box may be facilitated.

Figure 17:
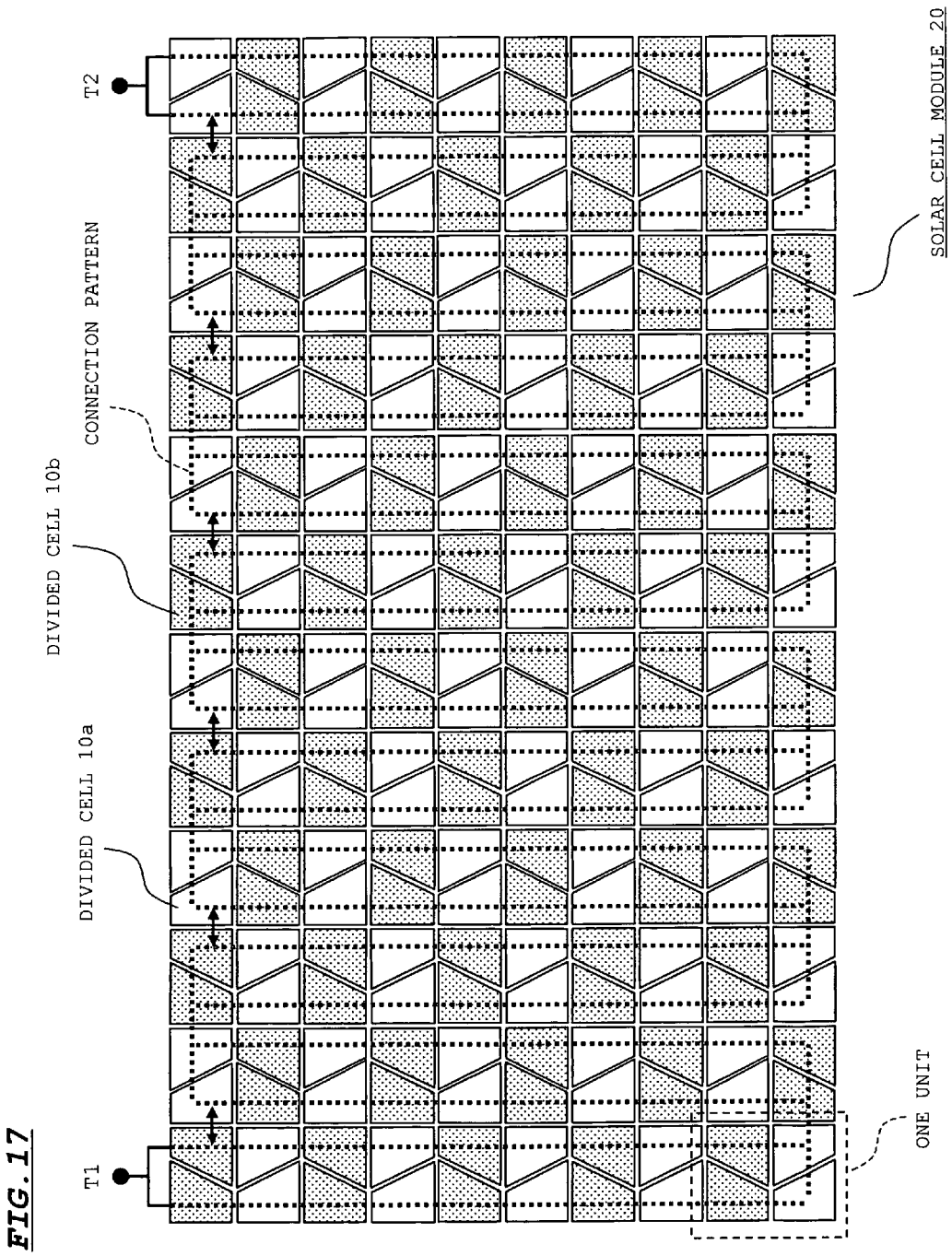
FIG. 17 illustrates different patterns of electrical connection and unit arrangement of the present invention.

FIG. 17 illustrates yet another pattern of electrical connection and a pattern of the unit arrangement corresponding to the connection pattern. It should be noted that, according to this example of the pattern, as shown in above FIG. 6A, four divided cells constitute a unit. Therefore, according to this example of the pattern, the units constituted from the four divided cells are electrically connected as in FIG. 6B, FIG. 7 or FIG. 8 in the above by arranging the units on a solar cell module 20 with making the short sides or the long sides to match each other, according to a pattern of electrical connection. With this, it is possible to construct the solar cell module capable of collecting photovoltaic current from the cells to generate power.

According to this example of the pattern, two adjacent divided cells that are in the inversed state to each other out of the divided cells on the connection pattern shown by the dotted line in the drawing are sequentially connected in serial, and two adjacent divided cells that are on the same side to each other are connected in parallel. With this, a connection pattern is realized in which the units are connected in parallel by two columns. In this pattern, too, as in the above case of FIG. 14, it is possible to pull out the output terminals Tl and T2 from the same side (long side) of the solar cell module, and therefore the arrangement of the terminal box may be facilitated. Further, the connection patterns come closer at positions indicated by arrows in the drawing, and therefore, it is possible to easily connect the bypass diode for preventing application of the reverse voltage to this position.

Figure 18:
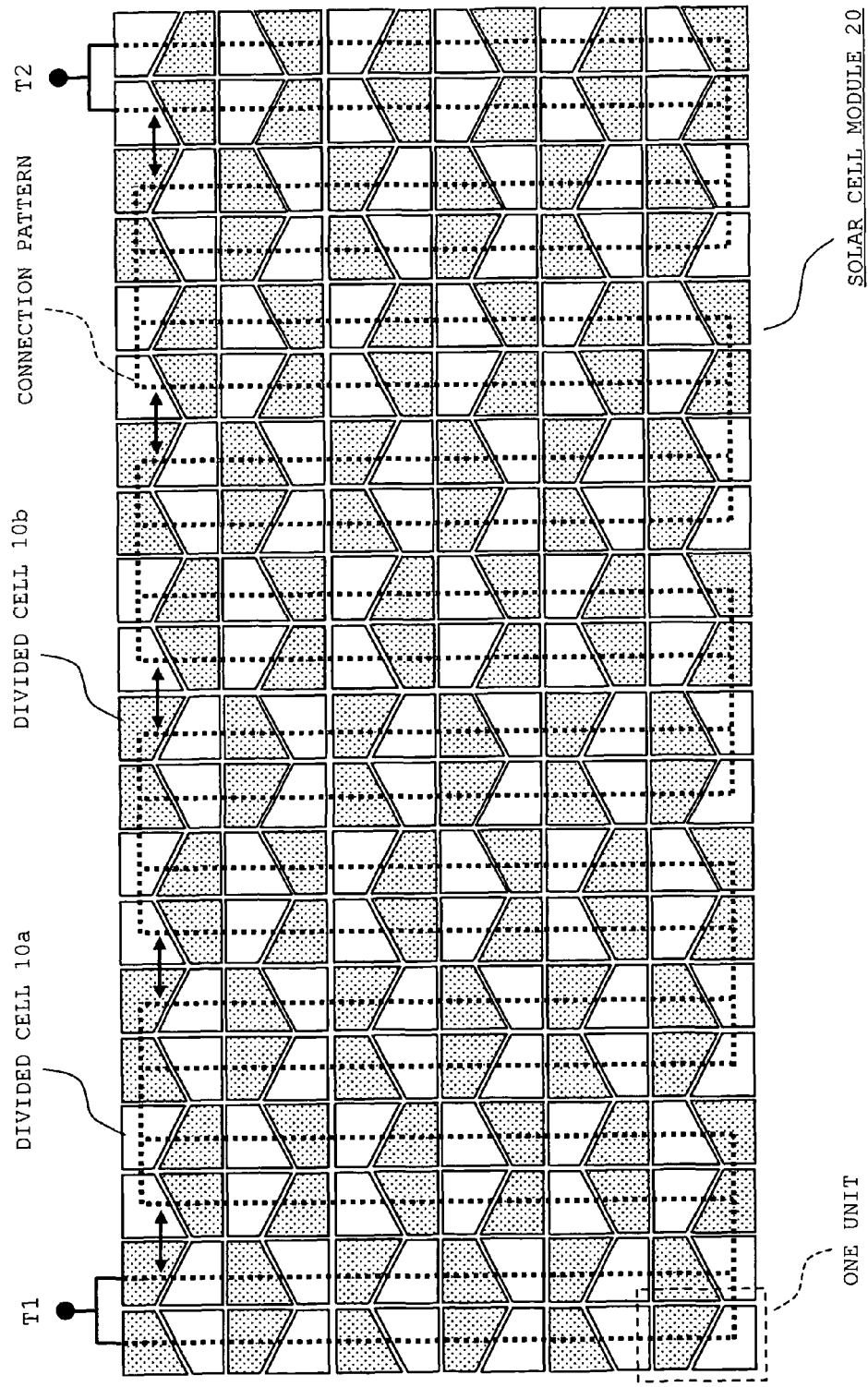
FIG. 18 illustrates different patterns of electrical connection and unit arrangement of the present invention.

FIG. 18 illustrates yet another pattern of electrical connection and a pattern of the unit arrangement corresponding to the connection pattern. It should be-noted that, according to this example of the pattern, similarly to FIG. 13 to FIG. 16 as shown above, two divided cells constitute a unit. According to this example of the pattern, two adjacent divided cells that are in the inversed state to each other out of the divided cells on the connection pattern shown by the dotted line in the drawing are sequentially connected in serial, and two adjacent divided cells that are on the same side to each other are connected in parallel. With this, a parallel connection pattern is realized in which the units are connected in parallel by two columns. In this pattern, too, as in the above case of FIG. 14, it is possible to pull out the output terminals T1 and T2 from the same side (long side) of the solar cell module, and therefore the arrangement of the terminal box maybe facilitated. Further, the connection patterns come closer at positions indicated by arrows in the drawing, and therefore, it is possible to easily connect the bypass diode for preventing application of the reverse voltage to this position.

Figure 19:
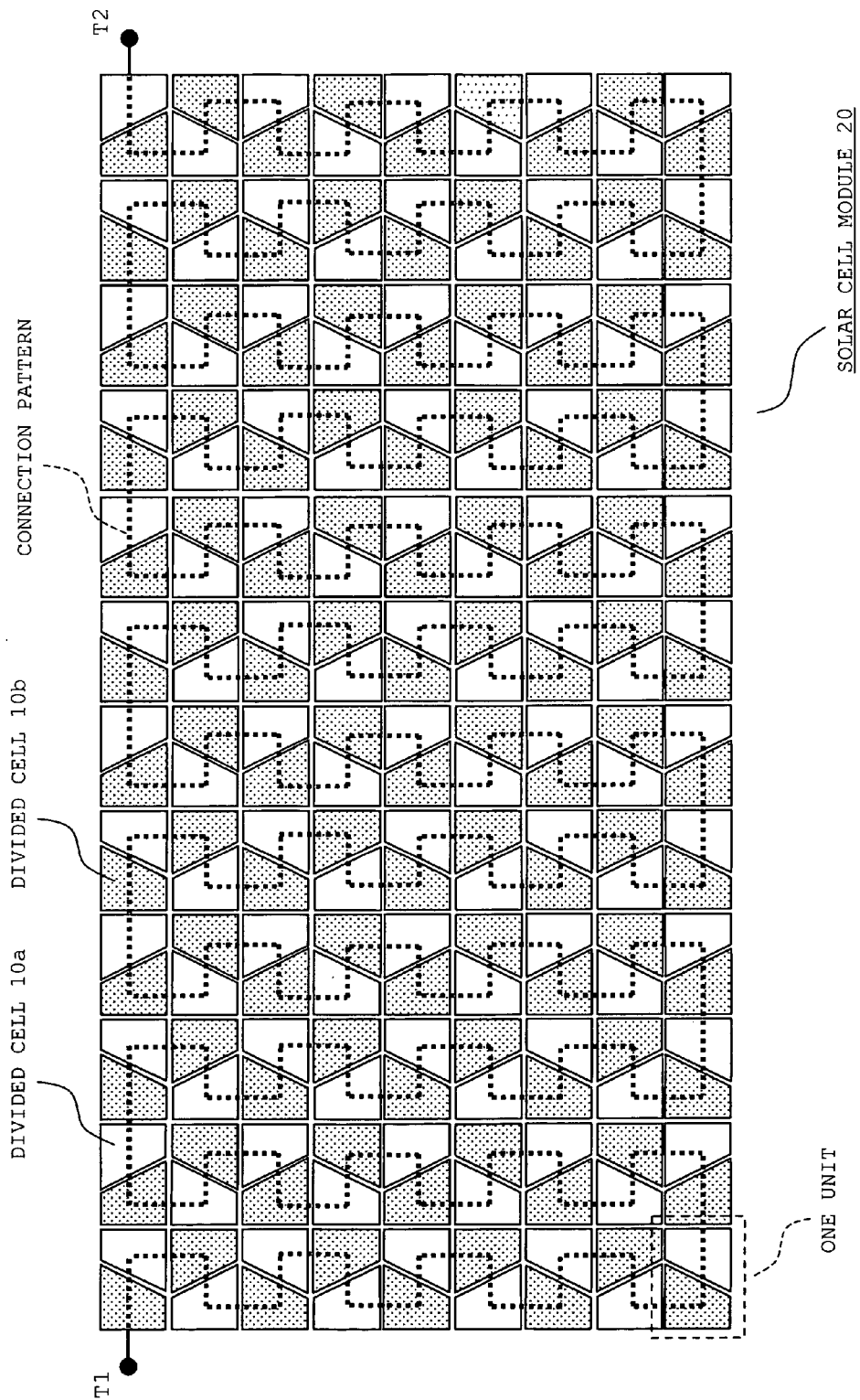
FIG. 19 illustrates different patterns of electrical connection and unit arrangement of the present invention.

FIG. 19 illustrates another pattern of electrical connection and a pattern of the unit arrangement corresponding to the connection pattern. According to this example of the pattern, the divided cells on the connection pattern shown by the dotted line in the drawing are sequentially connected in serial. With this, the serial connection pattern is realized in which all the divided cells are sequentially connected in serial.

Figure 20:
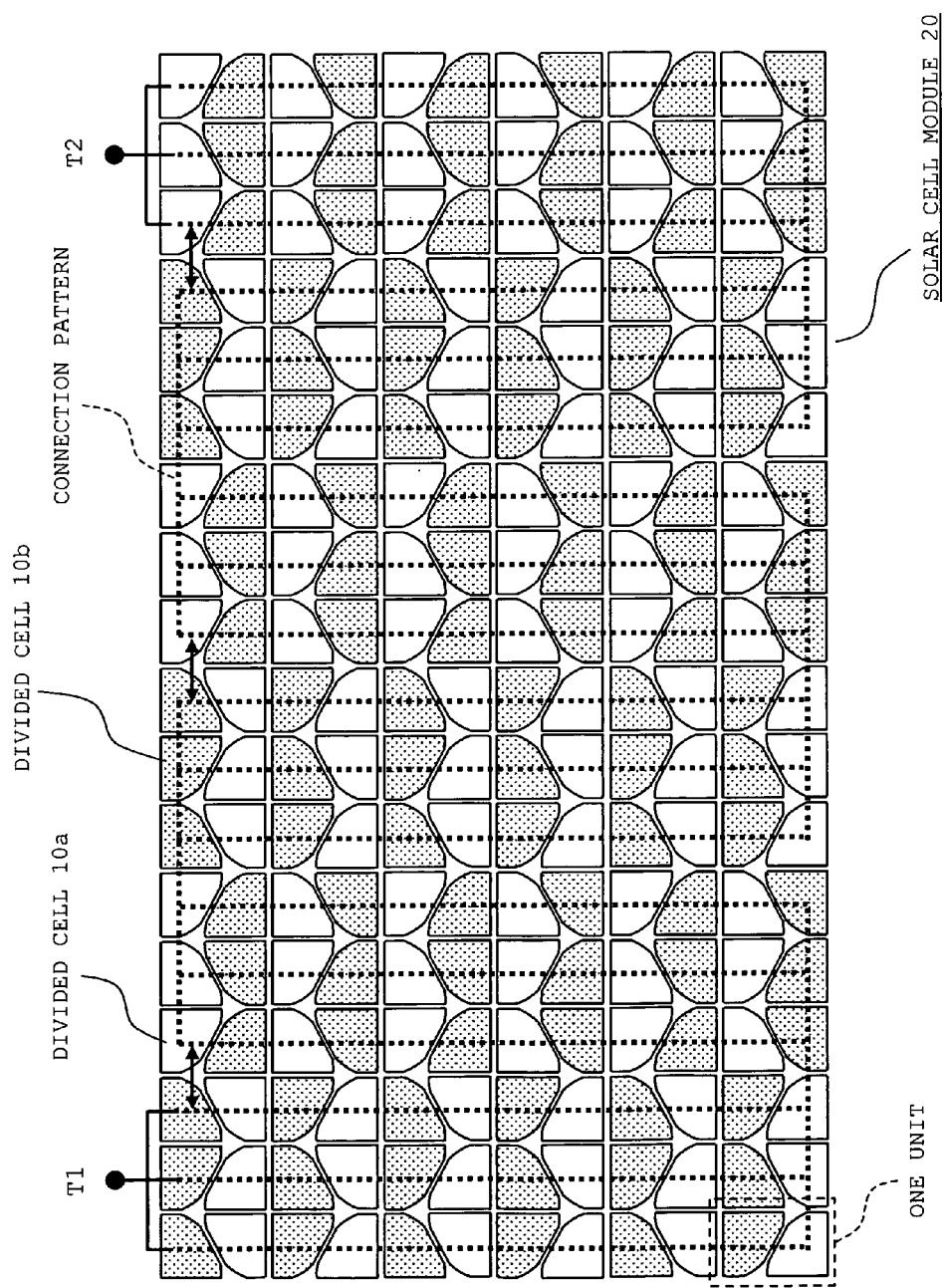
FIG. 20 illustrates different patterns of electrical connection and unit arrangement of the present invention.

FIG. 20 illustrates yet another pattern of electrical connection and a pattern of the unit arrangement corresponding to the connection pattern. It should be noted that, according to this example of the pattern, similarly to FIG. 13 to FIG. 16, FIG. 18, and FIG. 19 as shown above, two divided cells constitute a unit. According to this example of the pattern, two adjacent divided cells that are in the inversed state to each other out of the divided cells on the connection pattern shown by the dotted line in the drawing are sequentially connected in serial, and two adjacent divided cells that are on the same side to each other are connected in parallel. With this, a parallel connection pattern is realized in which the units are connected in parallel by three columns. It should be also noted that, according to this example of the pattern, the divided cells used here have the shape corresponding to the four pieces into which a pseudohexagon is divided.

In this pattern, too, as in the above case of FIG. 14 and FIG. 18, it is possible to pull out the output terminals T1 and T2 from the same side (long side) of the solar cell module, and therefore the arrangement of the terminal box may be facilitated. Further, the connection patterns come closer at positions indicated by arrows in the drawing, and therefore, it is possible to easily connect the bypass diode for preventing application of the reverse voltage to this position.

Figure 21B:
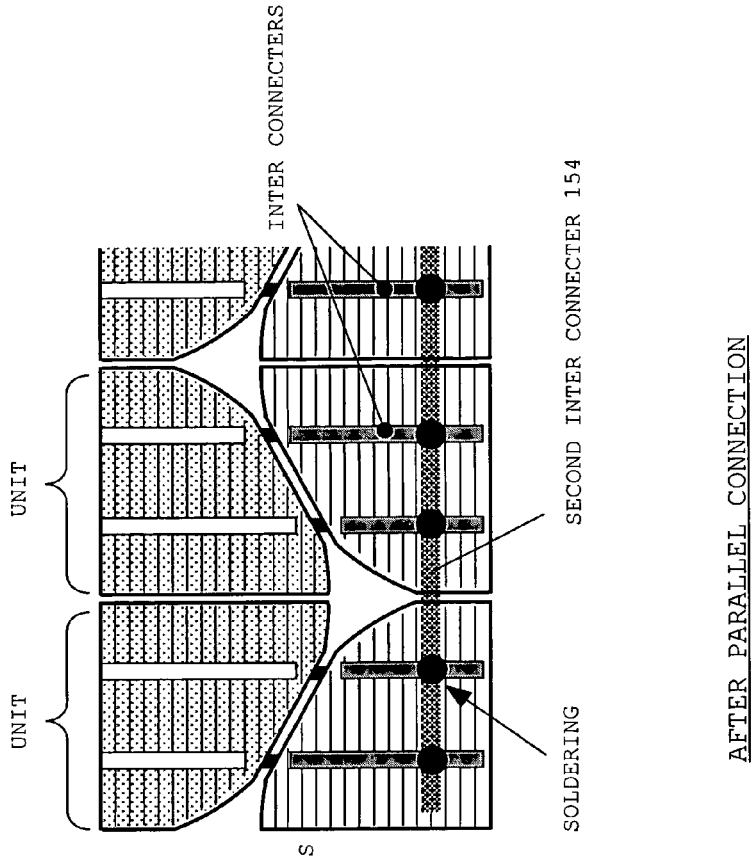
FIGS. 21A and 21B respectively illustrate modified examples of connection form between the units according to the embodiment of the present invention.
Figure 21A:
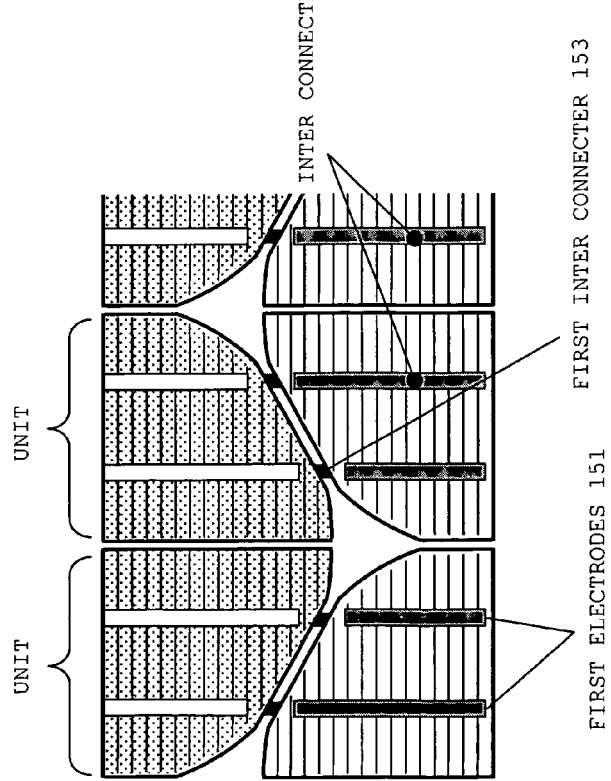

In the configuration example shown in FIG. 20, the units are connected in parallel by connecting the second electrodes 152 with the second inter connecters 154. However, as shown in FIG. 21, it is possible to connect the units in parallel by connecting the first electrodes 151 with the second inter connecters 154, instead of using the second electrodes 152. Specifically, mounting the inter connecters with solder dip on the first electrodes 151, disposing the second inter connecters 154 thereon so as to be perpendicular to the first electrodes 151, and heating intersections of the second inter connecters 154 and the first electrodes 151. With this, the second inter connecters 154 and the inter connecters on the first electrodes 151 are soldered at the intersections.

FIG. 22 is a view showing a module construction, where the respective divided cells are connected with the first inter connecters 153 and the second inter connecters 154, according to the pattern of electrical connection as shown in FIG. 20. In the drawing, the second inter connecters 154a and 154b are the inter connecters that connect the units, respectively, in serial and in parallel. The parallel connection between the units is carried out by connecting the second inter connecters 154b to the first electrodes 151 on the rear side using a method shown in FIG. 21. Further, the serial connection between the units is carried out by, as shown in the above, connecting the second inter connecters 154a to the first electrodes 151 on the rear side using a method shown in FIGS. 3A to 3B.

Figure 23:
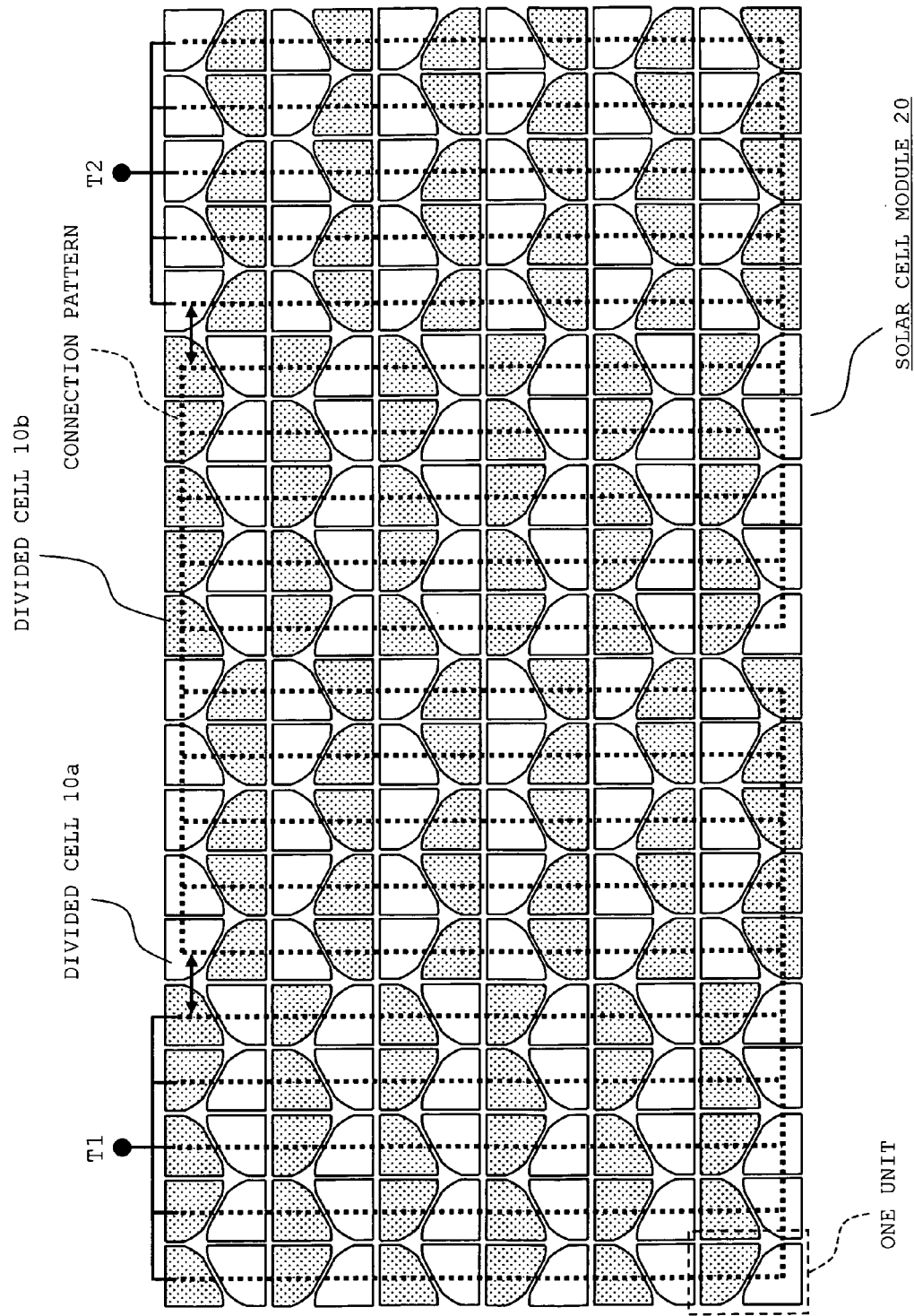
FIG. 23 illustrates different patterns of electrical connection and unit arrangement according to the embodiment of the present invention.

FIG. 23 illustrates yet another pattern of electrical connection and a pattern of the unit arrangement corresponding to the connection pattern. It should be noted that, according to this example of the pattern, as shown in above FIG. 13 to FIG. 16, and FIG. 18 to FIG. 20, two divided cells constitute a unit. According to this example of the pattern, two adjacent divided cells that are in the inversed state to each other out of the divided cells on the connection pattern shown by the dotted line in the drawing are sequentially connected in serial, and two adjacent divided cells that are on the same side to each other are connected in parallel. With this, a parallel connection pattern is realized in which the units are connected in parallel by five columns. It should be also noted that, according to this example of the pattern, as in the case of FIG. 20, the divided cells used here have the shape corresponding to the four pieces into which a pseudohexagon is divided.

In this pattern, too, as in the above case of FIG. 14, FIG. 18, and FIG. 20, it is possible to pull out the output terminals T1 and T2 made of copper foil from the same side (long side) of the solar cell module, and therefore the arrangement of the terminal box maybe facilitated. Further, the connection patterns come closer at positions indicated by arrows in the drawing, and therefore, it is possible to easily connect the bypass diode for preventing application of the reverse voltage to this position.

Figure 24:
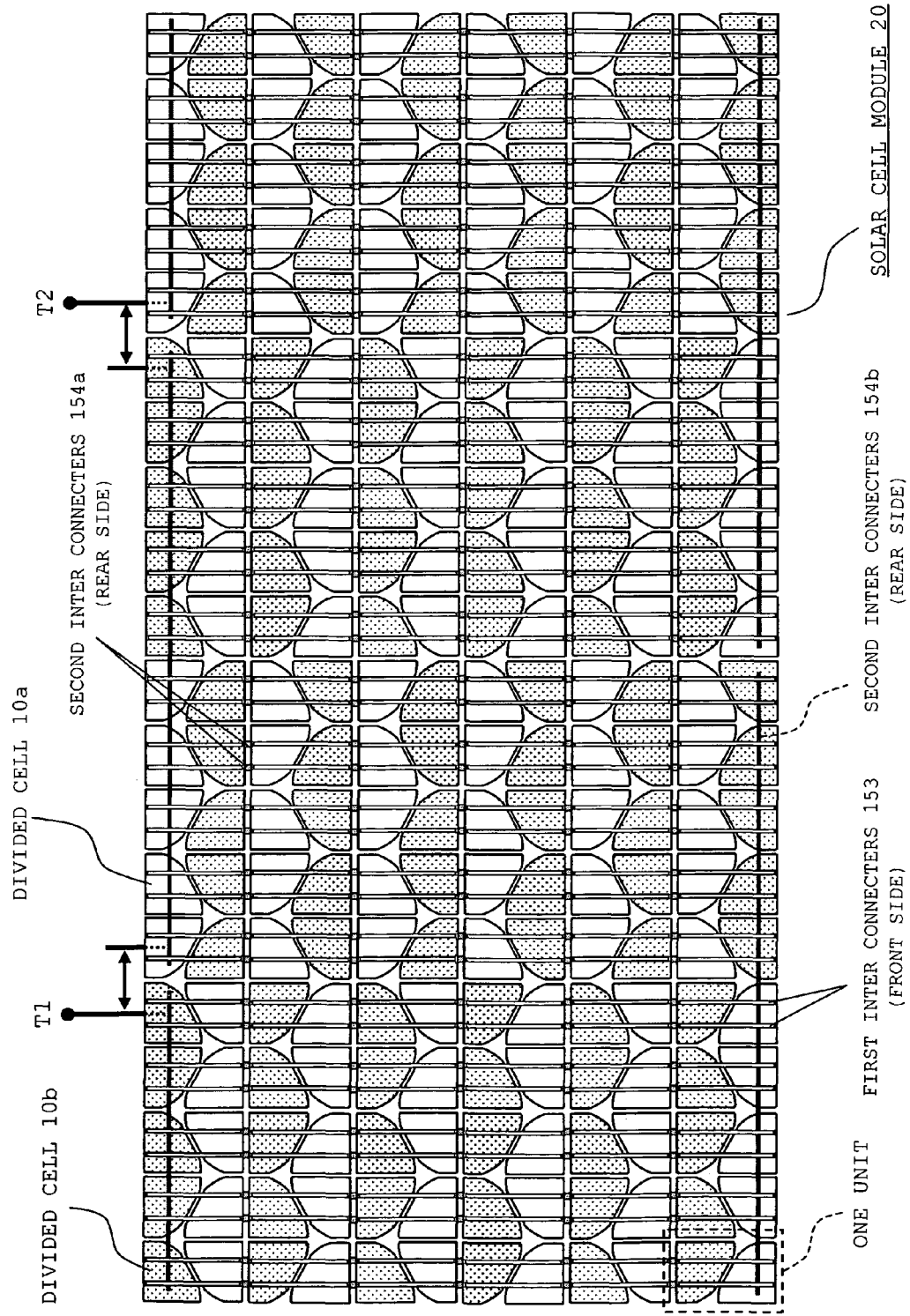
FIG. 24 illustrates the pattern of unit arrangement of FIG. 23 with the inter connecters superposed thereon.

FIG. 24 is a view showing a module construction, where the respective divided cells are connected with the first inter connecters 153 and the second inter connecters 154, according to the pattern of electrical connection as shown in FIG. 23. In the drawing, the second inter connecters 154a and 154b are the inter connecters that connect the units, respectively, in serial and in parallel. The parallel connection between the units is carried out by connecting the second inter connecters 154b to the first electrodes 151 on the rear side using a method shown in FIG. 21. Further, the serial connection between the units is carried out by, as shown in the above, connecting the second inter connecters 154a to the first electrodes 151 on the rear side using a method shown in FIGS. 3A to 3B.

Modified Examples of Connection between Units

Figure 25:
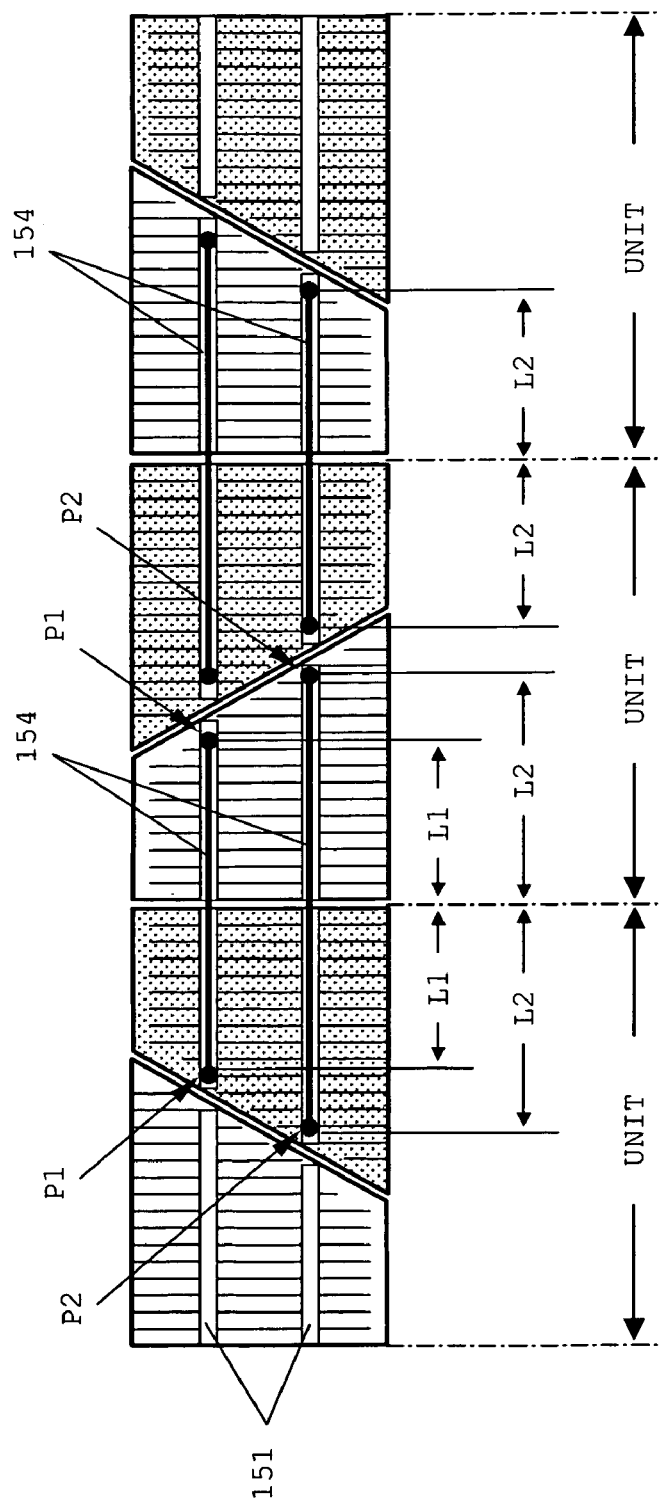
FIG. 25 illustrates a problem relating to connection form between the units according to the embodiment of the present invention.

In the above configuration examples, the units are electrically connected in such a manner, as shown in FIG. 25, that the second inter connecters 154 are arranged along the first electrodes 151 disposed on the adjacent two divided cells, and then, the second inter connecters 154 are soldered to the first electrodes 151 by heating the second inter connecters 154. However, according to this method, as shown in FIG. 25, a heating position P1 of one of the two second inter connecters 154 and a heating position P2 of the other are misaligned, and a distance (L2, for example) between a position at which the units adjoin each other and the heating position (P2, for example) also varies every other unit, as shown in the figure. Therefore, according to this method, a problem arises that a configuration of a device or a control for connecting the units becomes complicated.

Figure 26:
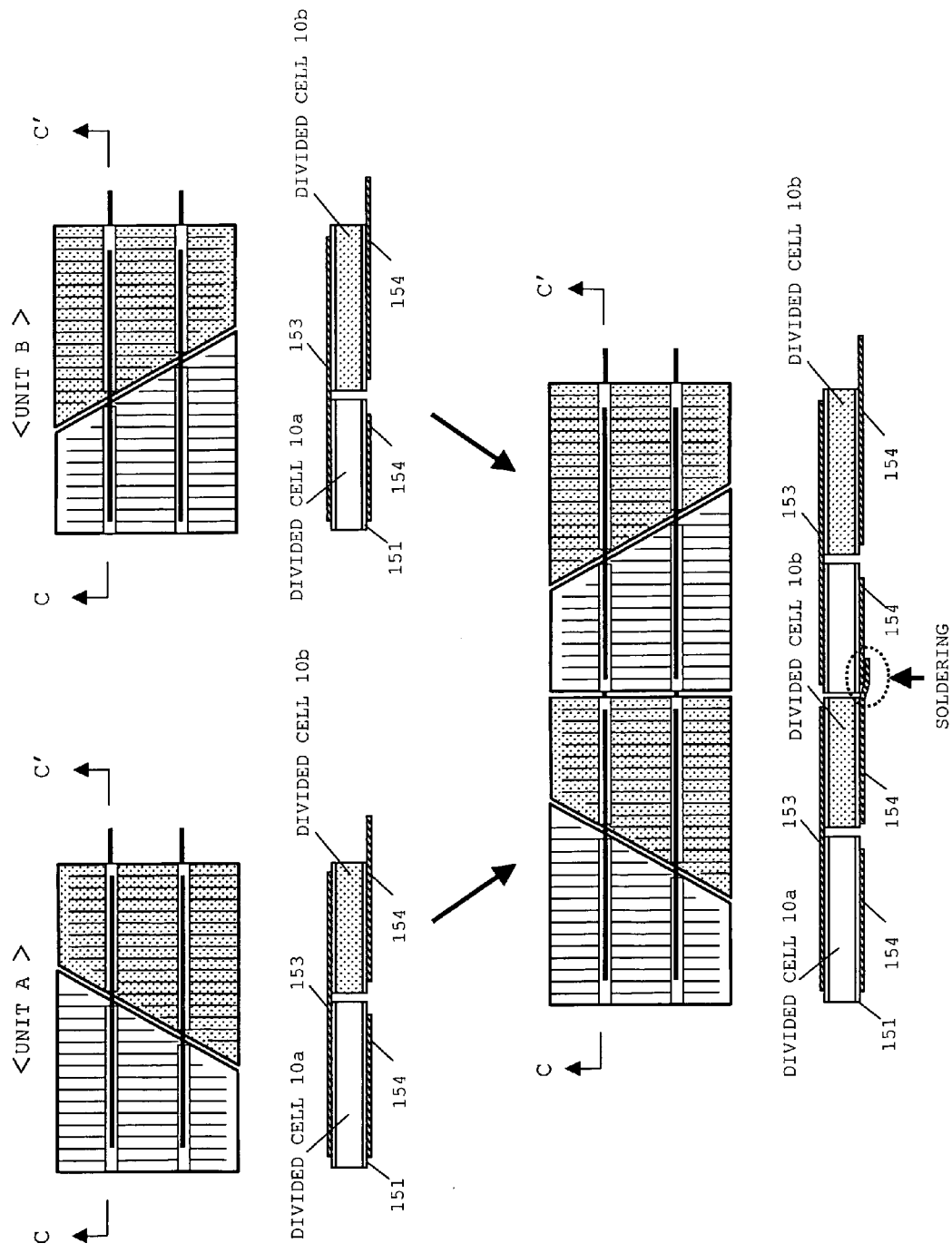
FIG. 26 illustrates a modified example of connection form between the units according to the embodiment of the present invention.

FIG. 26 illustrates a modified example of the connection between units that addresses such a problem. In this modified example, in order to construct a unit by connecting the first electrodes 151 disposed on the front side of the two divided cells 10a and 10b with the first inter connecters 153, the first electrodes 151 disposed on the rear side of the respective divided cells 10a and 10b are previouosly connected with the second inter connecters 154. At this time, the second inter connecters 154 connected to the rear side of the divided cells 10b protrude by a certain length from the end of the divided cells 10b. When connecting between the units, the second inter connecters 154 on the rear side of the divided cells 10a is overlapped with this. protruded portion, and then the overlapped portion is heated. With this, the both second inter connecters 154 are soldered each other at the heated portion, thereby electrically connecting the two units.

According to the connection method in FIG. 26, the connection position of the second inter connecters 154 (the heating position) may be fixed. Therefore, in comparison with the case of FIG. 25, the configuration of the device or the control for connecting between the units may be simplified. Further, when connecting between the units, the protruded portion of the second inter connecters 154 may be simply overlapped with the second inter connecters 154 on the rear side of the divided cells 10a. Accordingly, it is not necessary to provide a separate step in which the second inter connecters 154 are arranged along the two second inter connecters 154. Therefore, in comparison with the case of FIG. 25, the processing step for connecting between the units may be simplified.

Moreover, according to this connection method, it is not necessary to provide a flux at the connecting positions, because the second inter connecters 154 are connected each other. In other words, although it is necessary to apply the flux to the first electrodes 151 and to connect the second inter connecters 154 over the flux in the case in which the second inter connecters 154 are directly connected to the first electrodes 151, the second inter connecters 154 may be connected each other without applying the flux in the case in which the second inter connecters 154 are connected each other as shown in FIG. 26. As described above, according to the connection method shown in FIG. 26, it is possible to omit the step of applying the flux, and thus, the processing step for connecting between the units may be simplified.

Figure 27:
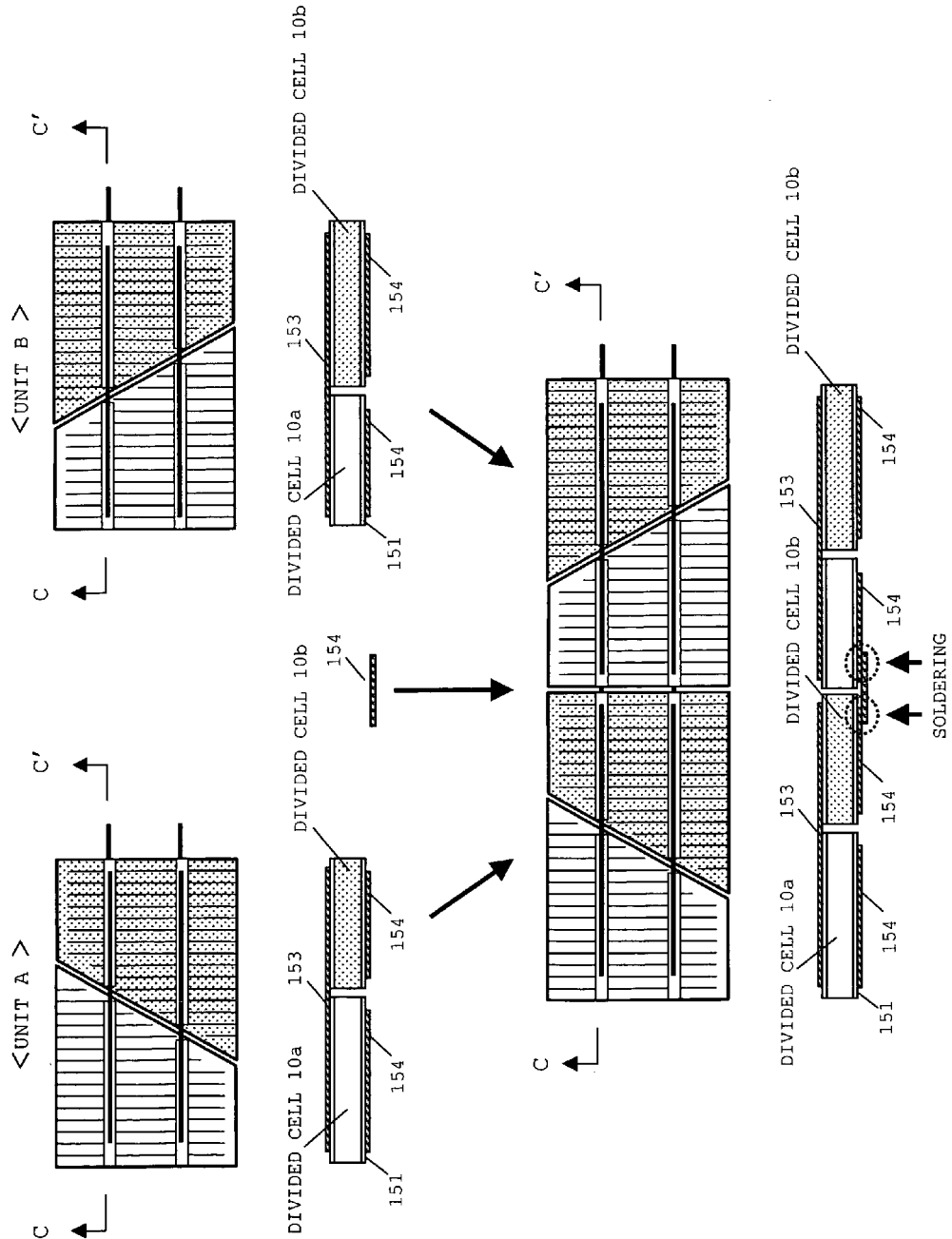
FIG. 27 illustrates a modified example of connection form between the units according to the embodiment of the present invention.
Figure 28:
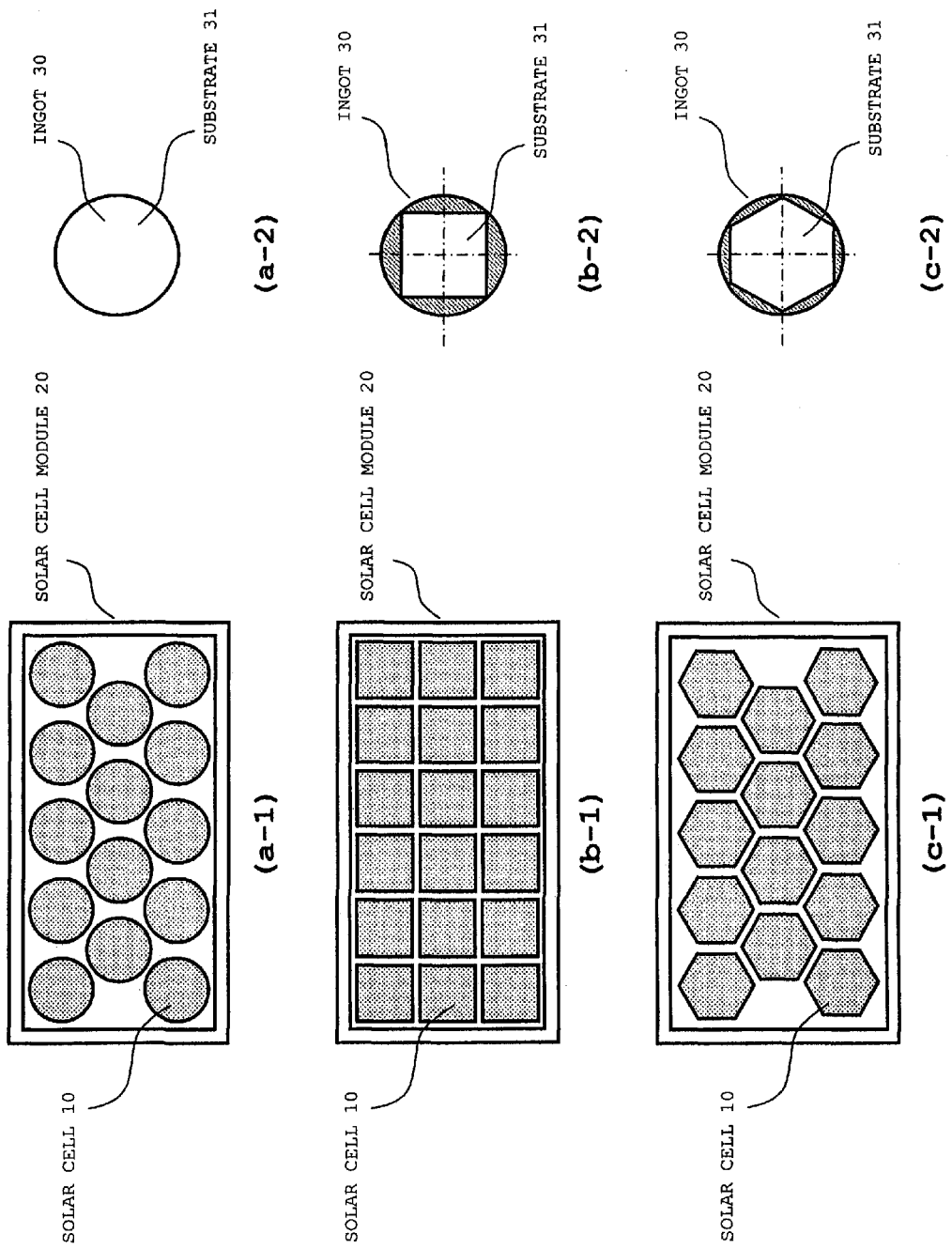
FIG. 28 illustrates conventional examples.

FIG. 27 illustrates another modified example of the connection between units. According to the above connection method shown in FIG. 26, the second inter connecters 154 are made to protrude for a certain length from the end of the divided cells 10b. In the configuration example shown in FIG. 28, instead of having the second inter connecters 154 be protruded, the second inter connecters 154 disposed on the rear side of the divided cells 10a and 10b are connected using different second inter connecters 154.

According to this connection method, as in the case of FIG. 26, the connection position of the second inter connecters 154 (the heating position) may be fixed. Therefore, in comparison with the case of FIG. 25, the configuration of the device or the control for connecting between the units may be simplified. Further, because the second inter connecters 154 are connected each other also in this method as in the case of FIG. 26, it is possible to omit the step of applying the flux, and thus, the processing step for connecting between the units may be simplified.

It should be noted that, the application of the connection methods shown in FIG. 26 and FIG. 27 are not limited to the forms shown in these drawings. It is possible to similarly apply the above methods to the cases in which the units are serially or parallely connected in a different form.

The embodiment according to the present invention has been described above. However, the present invention is not limited to the above-described embodiment. The embodiment of the present invention may be modified in various ways other than as described above.

Figure 30B:
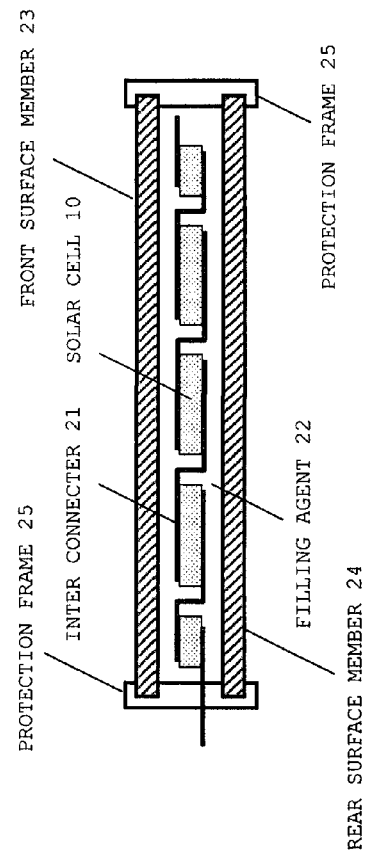
FIGS. 30A to 30B each illustrate a conventional example.
Figure 30A:
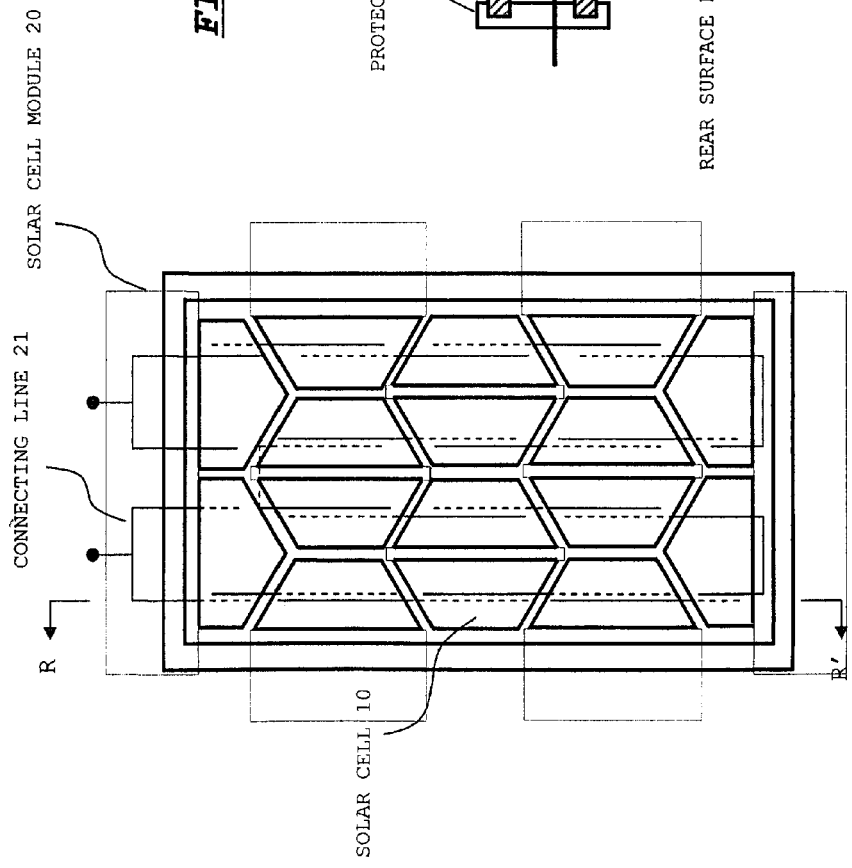
Figure 31B:
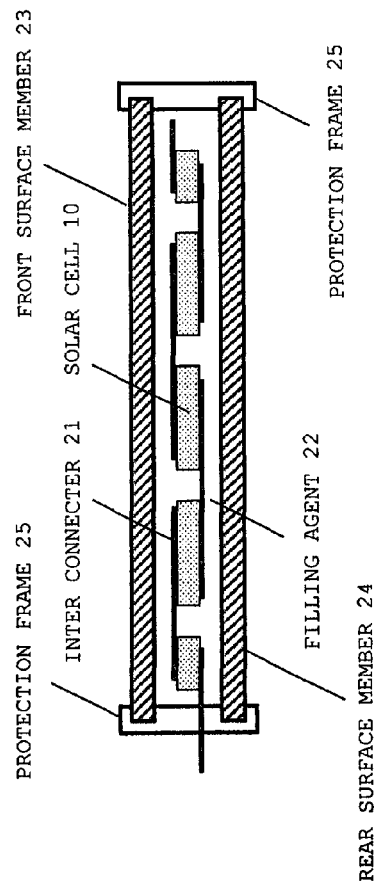
FIGS. 31A to 31B each illustrate a conventional example.
Figure 31A:
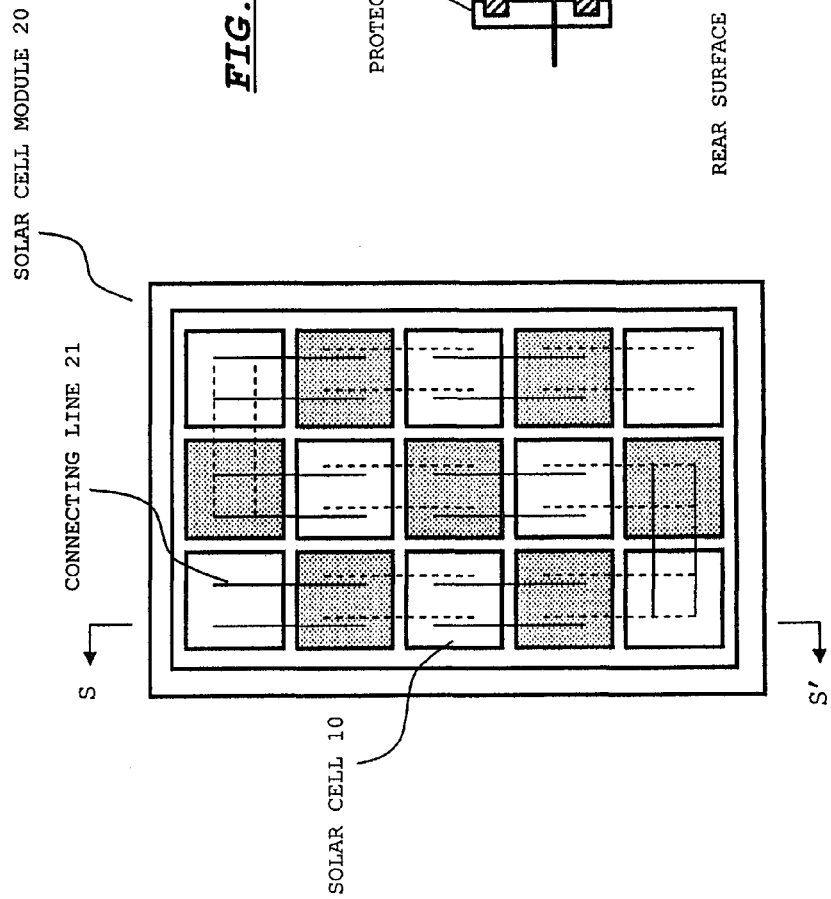

For example, in the above examples, when electrically connecting the divided cells in the unit and when electrically connecting the divided cells between the units, these divided cells are connected on the same side. However, as shown in FIG. 30B, for example, the both divided cells may be electrically connected by connecting one side and the other side with the inter connecters. In this case, however, it is necessary to provide the gaps between these divided cells for leading the inter connecters around, thereby reducing the workability and the filling rate of the cells in comparison with the above-described embodiment.

Further, although the double-side light receiving solar cells are used according to the above-described embodiment, monofacial solar cells may also be used. However, in this case, the serial connection of the divided cells is necessarily configured as the connection shown in FIG. 30B, thereby reducing the workability and the filling rate of the cells in comparison with the above-described embodiment.

In addition, according to the above-described present embodiment, the output terminals T1 and T2 are shown to be pulled out from the arrangement region of the divided cells in order to simplify the explanation. Various forms may be conceived of, such as leading the pulled out line around the rear side of the divided cells.

Moreover, the number of the units arranged in the solar cell module is not limited to the numbers shown in FIG. 13 to FIG. 24, and may be modified appropriately. However, in the case as shown in FIG. 14, while the output terminals T1 and T2 may be pulled out from the same side if the number of rows of the units that are arranged is an even number, the output terminals T1 and T2 are pulled out from positions of diagonal lines of opposing sides if the number is an odd number. This makes the arrangement of the terminal boxes complicated. Therefore, the number of the units to be arranged may be set to an appropriate number in view of the above noted points.

Furthermore, the present invention may be applied not only to the solar cell module to which the sunlight enters through a single surface, but also to the solar cell module to which the sunlight may enter through the both surfaces.

The embodiment of the present invention may be modified appropriately in various manner within the scope of the technical idea as defined by the claims of the invention.

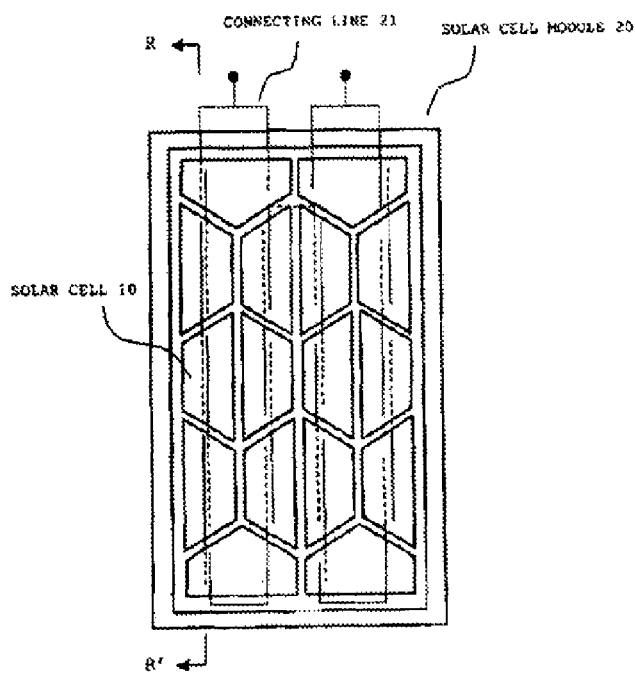

What is claimed is:

1. A manufacturing method of a solar cell module, comprising:
a cell dividing step of dividing a solar cell having electrodes formed on a surface thereof into separate solar cells each including separate electrodes, the separate solar cells each having a quadrangular shape with a side forming an oblique line, the electrodes being disposed on the solar cell before the division such that the separate electrodes formed on the respective quadrangular shaped solar cells are aligned along a straight line when the oblique lines of the respective quadrangular shaped solar cells are matched to each other;
a unitizing step of matching the oblique lines of respective quadrangular shaped solar cells to each other to form a rectangular outline, wherein the separate electrodes formed on the respective quadrangular shaped solar cells are aligned along a straight line when the oblique lines of the respective quadrangular shaped solar cells are matched to each other;
a cell unit forming step in which, while combining one or more pairs of the quadrangular shaped solar cells each formed by matching the oblique lines to each other to form the rectangular outline, relevant solar cells are connected with a first inter connecter, thereby forming a cell unit having an outline in either a rectangular shape or a square shape before arranged in the solar cell module; and
a unit connecting step in which, while arranging the cell units along a pattern of electric connection of the solar cell module with one sides of the outlines in either the rectangular shape or the square shape of the cell units respectively matching each other, relevant solar cells between predetermined adjacent cell units are connected with a second inter connecter.

2. The manufacturing method according to claim 1, wherein
the solar cells that constitute the cell unit are connected at surfaces on the same side with the first inter connecter.

3. The manufacturing method according to claim 2, wherein
the polarities of the surfaces on the same side of two of the solar cells connected with the first inter connecter are opposite each other.

4. The manufacturing method according to claim 3, wherein
each solar cell is a double-side light receiving solar cell.

5. The manufacturing method according to claim 1, wherein
each solar cell is provided with a first electrode connected to the first inter connecter when constructing the cell unit, and
the first electrode is arranged so that first electrodes of two solar cells to be connected are aligned along a first straight line, the first straight line being parallel with an arrangement direction of the two solar cells.

6. The manufacturing method according to claim 5, wherein
among a group of the solar cells that constitute the solar cell module, at least solar cells to be connected with the second inter connecter in a direction perpendicular to the first straight line are each provided with a second electrode that is perpendicular to the first straight line and connected to the second inter connecter, and
the second electrode is arranged so that second electrodes of two solar cells to be connected are aligned along a second straight line when connecting with the second inter connecter, the second straight line being parallel with the arrangement direction of the two solar cells.

7. The manufacturing method according to claim 6, wherein,
the second electrode is disposed on only one of both surfaces of each solar cell.

8. The manufacturing method according to claim 1, wherein
the unit connecting step includes:
disposing a first part of the second inter connecter on a surface of a first solar cell in a first cell unit;
disposing a second part of the second inter connecter, which is separate from the first part of the second inter connecter, on a surface of a second solar cell in a second cell unit, the second part of the second inter connecter protruding from an edge of the second cell unit by a predetermined length to form a protruding portion,
wherein the first solar cell and the second solar cell are adjacent and the first part of the second inter connecter and the second part of the second inter connecter are disposed on respective surfaces on the same side of the adjacent solar cells so that the first part of the second inter connecter and the second part of the second inter connecter align along a single straight line when arranged along the pattern of electrical connection; and
connecting the first cell unit and the second cell unit by overlapping the protruding portion of the second part of the second inter connecter with the first part of the second inter connecter and by soldering at the overlapping portion.

9. The manufacturing method according to claim 1, wherein
the unit connecting step includes:
disposing a first part of the second inter connecter on a surface of a first solar cell in a first cell unit;

disposing a second part of the second inter connecter, which is separate from the first part of the second inter connecter, on a surface of a second solar cell in a second cell unit, the first solar cell and the second solar cell being adjacent and the first part of the second inter connecter and the second part of the second inter connecter being disposed on respective surfaces on the same side of the adjacent solar cells so that the first part of the second inter connecter and the second part of the second inter connecter align along a single straight line when arranged along the pattern of electrical connection, and connecting the first cell unit and the second cell unit by soldering a third part of the second inter connecter, which is formed separately from the first part of the second inter connecter and the second part of the second inter connecter, to the first part of the second inter connecter and the second part of the second inter connecter so that the third part of the second inter connecter bridges over the first part of the second inter connecter and the second part of the second inter connecter.

10. The manufacturing method according to claim 1, wherein the solar cell has a shape obtained when either a regular hexagon or a pseudohexagon is divided by a straight line connecting a pair of opposing apexes of the shape and by another straight line that perpendicularly intersects with the straight line and connecting center points of a pair of opposing sides of the shape.

11. The manufacturing method according to claim 10, wherein the solar cell is formed by dividing a solar cell plate, having a shape of either the regular hexagon or the pseudohexagon, on which a first electrode and a second electrode to be connected to the first and second inter connecter respectively are provided, by a straight line connecting a pair of opposing apexes of the shape and by another straight line that perpendicularly intersects with the straight line and connecting center points of a pair of opposing sides of the shape.

* * * * *

UNITED STATES PATENT AND TRADEMARK OFFICE
CERTIFICATE OF CORRECTION

PATENT NO. : 8,067,295 B2
APPLICATION NO. : 11/527494
DATED : November 29, 2011
INVENTOR(S) : Toshio Yagiura et al.

Page 1 of 3

Figure 29A:
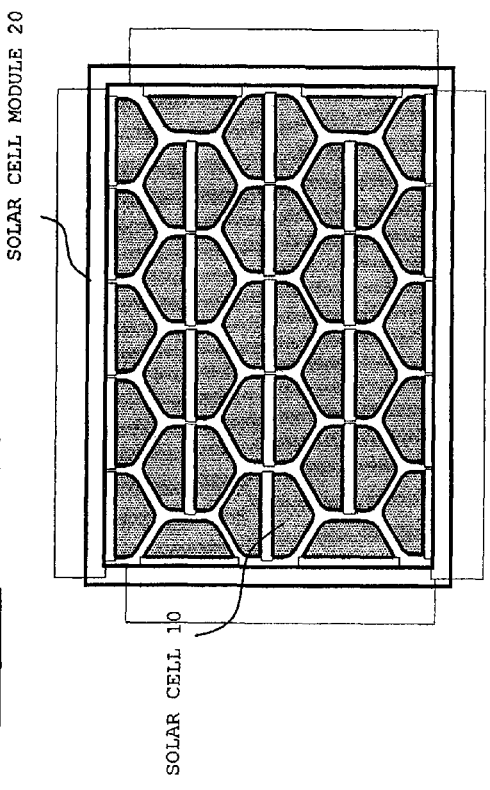

It is certified that error appears in the above-identified patent and that said Letters Patent is hereby corrected as shown below:

IN FIG. 29A:
Change

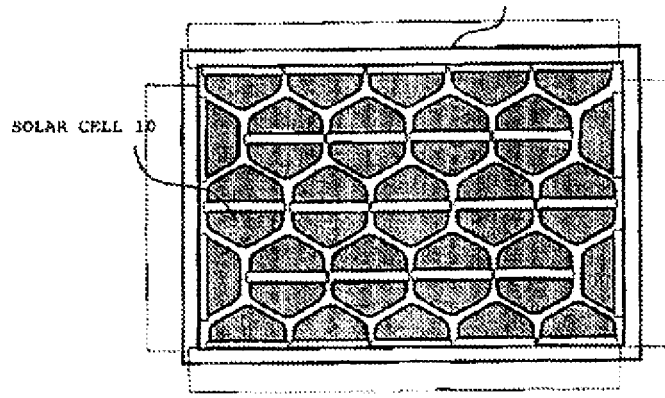

To be

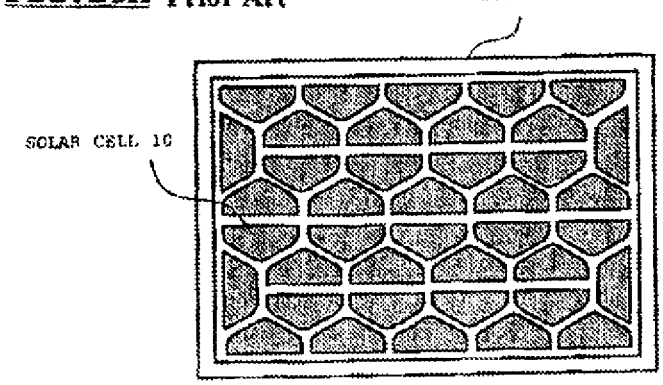

Signed and Sealed this
Twenty-third Day of October, 2012

David J. Kappos
*Director of the United States Patent and Trademark Office*

Figure 29C:
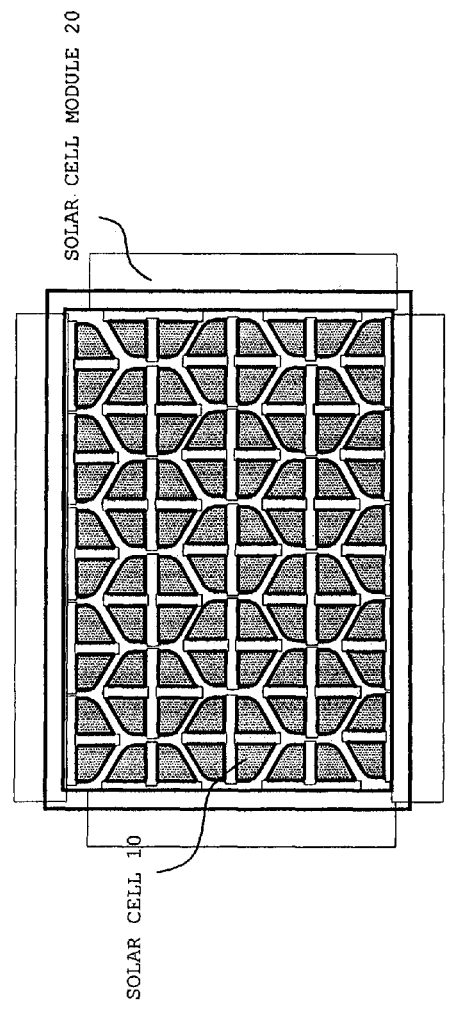

IN FIG. 29C:
Change
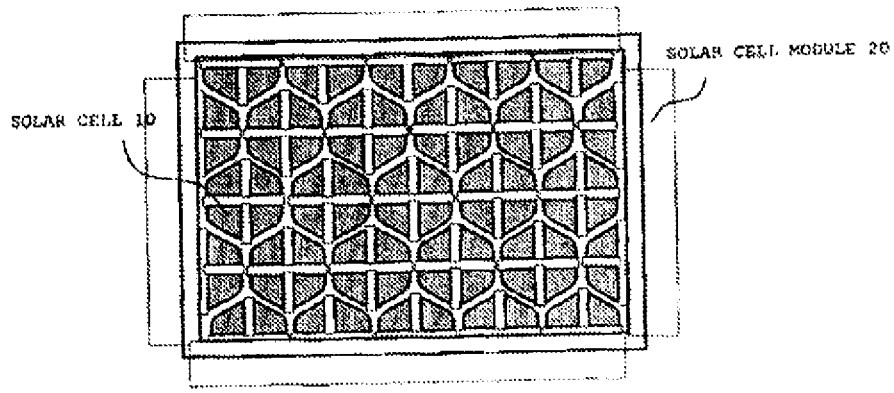
To be
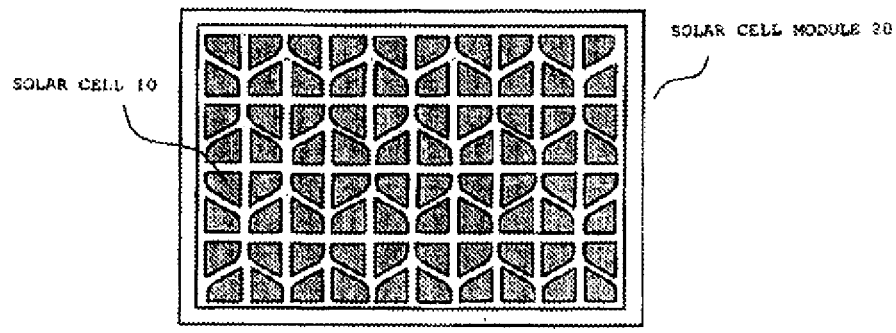

CERTIFICATE OF CORRECTION (continued)

U.S. Pat. No. 8,067,295 B2

IN FIG. 30A:

Change

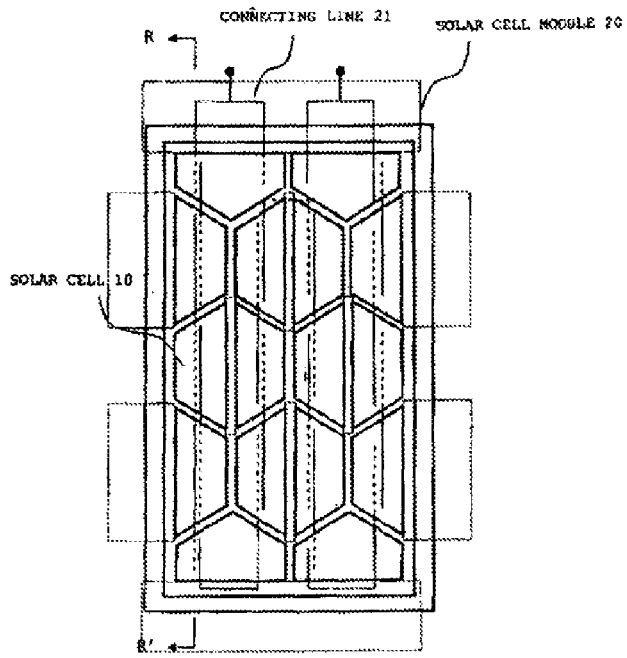

To be